United States Patent
Woo

(10) Patent No.: US 11,908,957 B2
(45) Date of Patent: Feb. 20, 2024

(54) SOLAR CELL MODULE

(71) Applicant: Shangrao Xinyuan YueDong Technology Development Co. Ltd, Jiangxi Province (CN)

(72) Inventor: Taeki Woo, Seoul (KR)

(73) Assignee: Shangrao Xinyuan YueDong Technology Development Co., Ltd, Jiangxi Province (CN)

( * ) Notice: Subject to any disclaimer, the term of this patent is extended or adjusted under 35 U.S.C. 154(b) by 0 days.

(21) Appl. No.: 14/622,034

(22) Filed: Feb. 13, 2015

(65) Prior Publication Data
US 2015/0243798 A1 Aug. 27, 2015

(30) Foreign Application Priority Data

Feb. 24, 2014 (KR) .................. 10-2014-0021564

(51) Int. Cl.
*H01L 31/02* (2006.01)
*H01L 31/05* (2014.01)
*H01L 31/068* (2012.01)

(52) U.S. Cl.
CPC ...... *H01L 31/0201* (2013.01); *H01L 31/0516* (2013.01); *H01L 31/0682* (2013.01); *Y02E 10/547* (2013.01)

(58) Field of Classification Search
CPC . H01L 31/0516; H01L 31/0682; H01L 31/05; H01L 31/0508; H01L 31/0201
See application file for complete search history.

(56) References Cited

U.S. PATENT DOCUMENTS 9,553,226 B2 * 1/2017 Kim ............... H01L 31/0504
10,002,985 B2 * 6/2018 Kwon ............. H01L 31/0216
10,361,322 B2 * 7/2019 Kim ............... H01L 31/0508
(Continued)

FOREIGN PATENT DOCUMENTS

CN 102790110 A 11/2012
CN 103107210 A 5/2013
(Continued)

OTHER PUBLICATIONS

Machine translation of JP 2011003724 A.*
(Continued)

*Primary Examiner* — Bethany L Martin
(74) *Attorney, Agent, or Firm* — Pillsbury Winthrop Shaw Pittman, LLP; Chad Hammerlind

(57) ABSTRACT

A solar cell module includes first and second solar cells each including a plurality of first and second electrodes formed on a back surface of a semiconductor substrate, a first conductive line connected to the first electrodes, and a second conductive line connected to the second electrodes, and an interconnector connecting the first conductive line of the first solar cell to the second conductive line of the second solar cell. At least one of an area of an overlap portion, an area of a connection portion, a connection position, and a connection shape between the interconnector and the first conductive line of the first solar cell is different from at least one of an area of an overlap portion, an area of a connection portion, a connection position, and a connection shape between the interconnector and the second conductive line of the second solar cell.

26 Claims, 14 Drawing Sheets

(56) References Cited

U.S. PATENT DOCUMENTS

| | | | |
|---|---|---|---|
| 10,483,421 B2 * | 11/2019 | Kim | H01L 31/0516 |
| 10,516,070 B2 * | 12/2019 | Lim | H01L 31/022441 |
| 2008/0216887 A1 * | 9/2008 | Hacke | H01L 31/022441 |
| | | | 136/244 |
| 2009/0139557 A1 * | 6/2009 | Rose | H01L 31/18 |
| | | | 136/244 |
| 2009/0183759 A1 | 7/2009 | Hishida | |
| 2010/0139746 A1 * | 6/2010 | Von Maydell | |
| | | | H01L 31/022433 |
| | | | 136/255 |
| 2011/0120530 A1 * | 5/2011 | Isaka | H01L 31/022441 |
| | | | 136/251 |
| 2012/0103389 A1 * | 5/2012 | Shin | H01L 31/0504 |
| | | | 136/244 |
| 2012/0291838 A1 * | 11/2012 | Jang | H01L 31/022441 |
| | | | 136/244 |
| 2013/0081674 A1 | 4/2013 | Joe et al. | |
| 2013/0213452 A1 * | 8/2013 | Ide | H01L 31/0516 |
| | | | 136/244 |
| 2013/0333743 A1 | 12/2013 | Ishii et al. | |

FOREIGN PATENT DOCUMENTS

| | | | | |
|---|---|---|---|---|
| EP | 2184787 A1 | | 12/2010 | |
| EP | 2624314 A1 | | 8/2013 | |
| JP | 2009-176782 A | | 8/2009 | |
| JP | 2010-157530 A | | 7/2010 | |
| JP | 2011-3724 A | | 1/2011 | |
| JP | 2012-49390 A | | 3/2012 | |
| JP | 2012-74414 A | | 4/2012 | |
| JP | 2012-182168 A | | 9/2012 | |
| JP | 2014127552 A | * | 7/2014 | |
| JP | 2014127553 A | * | 7/2014 | |
| KR | 10-2010-0019389 A | | 2/2010 | |
| KR | 20100123163 A | * | 11/2010 | |
| KR | 101295541 B1 | * | 8/2013 | |
| WO | WO 2008/090718 A1 | | 7/2008 | |
| WO | WO-2011011855 A1 | * | 2/2011 | H01L 31/022441 |
| WO | WO 2013/094556 A1 | | 6/2013 | |
| WO | WO 2013/161810 A1 | | 10/2013 | |

OTHER PUBLICATIONS

Machine Translation of KR-20100123163-A.*
Honsberg, Christiana, and Stuart Bowden. "Mismatch Effects in Arrays." PVEducation, https://www.pveducation.org/pvcdrom/modules-and-arrays/mismatch-effects-in-arrays.*
First Office Action for related Chinese Patent Application 201510087629.9 dated Jul. 1, 2016, pp. 1 to 18.
Second Office Action for related Chinese Patent Application 201510087629.9 dated Mar. 8, 2017, pp. 1 to 30.

* cited by examiner

OS1 ≠ OS2, DCI1 ≠ DCI2
CS1 ≠ CS2

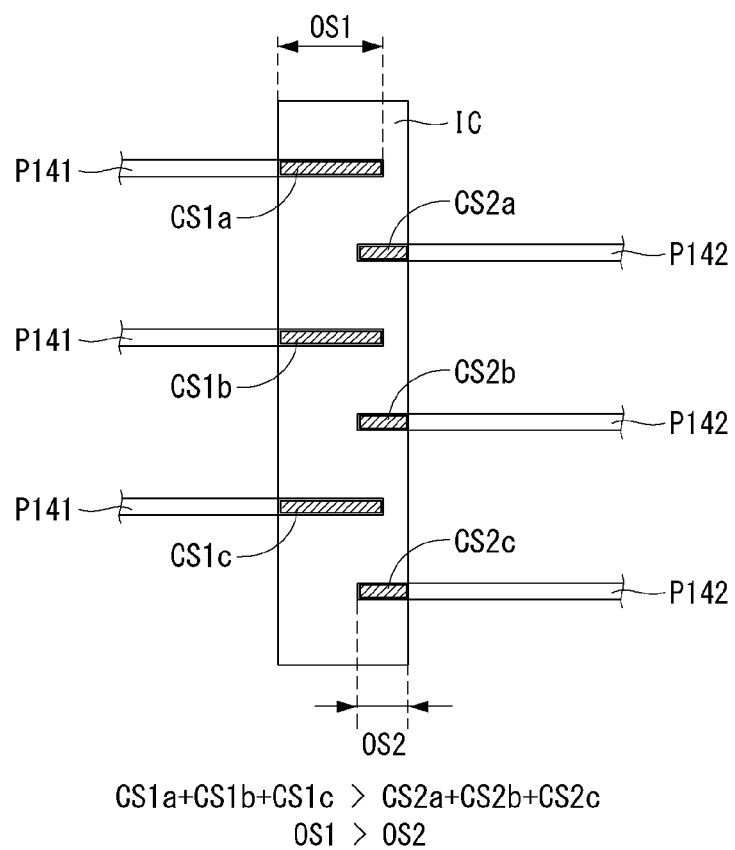

CS1c(CS2c) < CS1a(CS2a) < CS1b(CS2b)

D1 > D2

SOLAR CELL MODULE

CROSS-REFERENCE TO RELATED APPLICATION

This application claims priority to and the benefit of Korean Patent Application No. 10-2014-0021564 filed in the Korean Intellectual Property Office on Feb. 24, 2014, the entire contents of which are incorporated herein by reference.

BACKGROUND OF THE INVENTION

Field of the Invention

Embodiments of the invention relate to a solar cell module.

Description of the Related Art

A solar cell generally includes a substrate and an emitter region, which are formed of semiconductors of different conductive types, for example, a p-type and an n-type, and electrodes respectively connected to the substrate and the emitter region. A p-n junction is formed at an interface between the substrate and the emitter region.

In particular, a solar cell, in which electrodes are not formed on a light receiving surface of a silicon substrate and n-type electrodes and p-type electrodes are formed only on another surface of the silicon substrate, has been continuously studied and developed, so as to increase efficiency of the solar cell. Further, a module technology for electrically connecting the plurality of solar cells each having the above-described configuration has been continuously studied and developed.

Examples of the module technology typically include a method for electrically connecting the plurality of solar cells using metal interconnectors and a method for electrically connecting the plurality of solar cells using a wiring substrate, on which wires are previously formed.

SUMMARY OF THE INVENTION

In one aspect, there is a solar cell module including a first solar cell and a second solar cell each including a plurality of first and second electrodes, which are formed on a back surface of a semiconductor substrate and are separated from each other, a first conductive line connected to the plurality of first electrodes, and a second conductive line connected to the plurality of second electrodes, and an interconnector configured to electrically connect the first conductive line of the first solar cell to the second conductive line of the second solar cell, wherein at least one of an area of an overlap portion, an area of a connection portion, a connection position, and a connection shape between the interconnector and the first conductive line of the first solar cell is different from at least one of an area of an overlap portion, an area of a connection portion, a connection position, and a connection shape between the interconnector and the second conductive line of the second solar cell.

The interconnector may overlap the first and second conductive lines of the first and second solar cells. A first connection portion between the interconnector and the first conductive line of the first solar cell may be separated in an overlap portion between the interconnector and the first conductive line and may be in the plural. A second connection portion between the interconnector and the second conductive line of the second solar cell may be separated in an overlap portion between the interconnector and the second conductive line and may be in the plural.

The interconnector may be connected to the first and second conductive lines of the first and second solar cells using an interconnector adhesive formed of a conductive material. Even in this instance, an area of a first application portion of the interconnector adhesive in an overlap portion between the interconnector and the first conductive line may be different from an area of a second application portion of the interconnector adhesive in an overlap portion between the interconnector and the second conductive line.

The first application portion in the overlap portion between the interconnector and the first conductive line may be separated in a second direction crossing a first direction and may be in the plural. The second application portion in the overlap portion between the interconnector and the second conductive line may be separated in the second direction and may be in the plural. In this instance, the total area of the plurality of first application portions may be different from the total area of the plurality of second application portions.

The interconnector may extend in a second direction crossing a first direction. An area of one of the plurality of first connection portions may be different from an area of one of the plurality of second connection portions, which is symmetrical to the one first connection portion about a central line of the interconnector parallel to the second direction.

The interconnector may overlap the first conductive line of the first solar cell and the second conductive line of the second solar cell. A first overlap area between the interconnector and the first conductive line may be different from a second overlap area between the interconnector and the second conductive line.

The connection of the first solar cell and the second solar cell using the interconnector may be arranged in a first direction. A first overlap width between the interconnector and the first conductive line in the first direction may be different from a second overlap width between the interconnector and the second conductive line in the first direction. An overlap length between the interconnector and the first conductive line in a second direction crossing the first direction may be the same as an overlap length between the interconnector and the second conductive line in the second direction.

In each of the first and second solar cells, the first conductive line may include first connectors connected to the first electrodes and a first pad having one side connected to ends of the first connectors and the other side connected to the interconnector. Further, the second conductive line may include second connectors connected to the second electrodes and a second pad having one side connected to ends of the second connectors and the other side connected to the interconnector.

In each of the first and second solar cells, each of the first and second conductive lines may be configured as a plurality of wires. A sum of areas of a plurality of first connection portions between the interconnector and the first conductive line having the plurality of wires in the first solar cell may be different from a sum of areas of a plurality of second connection portions between the interconnector and the second conductive line having the plurality of wires in the second solar cell.

In each of the first and second solar cells, a connection position or a connection area of at least one of the plurality of first connection portions connected to the interconnector may be different from a connection position or a connection area of the remaining first connection portions.

In each of the first and second solar cells, a connection position or a connection area of at least one of the plurality of second connection portions connected to the interconnector may be different from a connection position or a connection area of the remaining second connection portions.

In another aspect, there is a solar cell module including a first solar cell and a second solar cell each including a plurality of first and second electrodes, which are formed on a back surface of a semiconductor substrate and are separated from each other, a first conductive line connected to the plurality of first electrodes, and a second conductive line connected to the plurality of second electrodes, and an interconnector configured to electrically connect the first conductive line of the first solar cell to the second conductive line of the second solar cell, wherein each of a first connection portion between the interconnector and the first conductive line of the first solar cell and a second connection portion between the interconnector and the second conductive line of the second solar cell includes a plurality of first connection parts and a plurality of second connection parts, respectively, and wherein at least one of the first connection parts has a size that is different from an adjacent first connection part or an adjacent second connection part that is disposed in at least one of a first direction and a second direction from the at least one of the first connection part.

The at least one of the first connection parts may have a size that is different from the adjacent second connection part that is disposed in the second direction from the at least one of the first connection part.

The at least one of the first connection parts may have a size that is different from both the adjacent first connection part and the adjacent second connection part that are disposed in the first direction and the second direction from the at least one of the first connection part, respectively.

The first connection portion may be a portion of adhesion between the interconnector and the first conductive line of the first solar cell, and the second connection portion may be a portion of adhesion between the interconnector and the second conductive line of the second solar cell.

In yet another aspect, there is a solar cell module including a first solar cell and a second solar cell each including a semiconductor substrate and a plurality of first electrodes and a plurality of second electrodes, which are formed on a back surface of the semiconductor substrate and are separated from each other, a plurality of first conductive lines connected to the plurality of first electrodes in each of the first and second solar cells, a plurality of second conductive lines connected to the plurality of second electrodes in each of the first and second solar cells, and an interconnector configured to electrically connect the plurality of first conductive lines of the first solar cell to the plurality of second conductive lines of the second solar cell, wherein in each of the first and second solar cells, each of the plurality of first and second electrodes extends in a first direction, and wherein each of the plurality of first and second conductive lines extends in a second direction crossing the first direction.

At least one of an area of an overlap portion, an area of a connection portion, a connection position, and a connection shape between the interconnector and the first conductive line of the first solar cell may be different from at least one of an area of an overlap portion, an area of a connection portion, a connection position, and a connection shape between the interconnector and the second conductive line of the second solar cell.

The plurality of first conductive lines may be connected to the plurality of first electrodes through an electrode adhesive, and the plurality of second conductive lines may be connected to the plurality of second electrodes through the electrode adhesive.

An insulating layer may be positioned between the plurality of first conductive lines and the plurality of second electrodes and between the plurality of second conductive lines and the plurality of first electrodes.

The interconnector may extend in the first direction. The first and second solar cells may be connected in series to each other in the second direction through the interconnector.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 11 to 15B illustrate a solar cell module, in which first and second conductive lines are configured as a plurality of wires.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It should be noted that a detailed description of known arts will be omitted if it is determined that the detailed description of the known arts can obscure the embodiments of the invention.

In the following description, "front surface" may be one surface of a semiconductor substrate, on which light is directly incident, or one surface of a front glass substrate, and "back surface" may be a surface opposite the one surface of the semiconductor substrate or the front glass substrate, on which light is not directly incident or reflective light may be incident.

Exemplary embodiments of the invention will be described with reference to FIGS. 1 to 15B.

Figure 1:
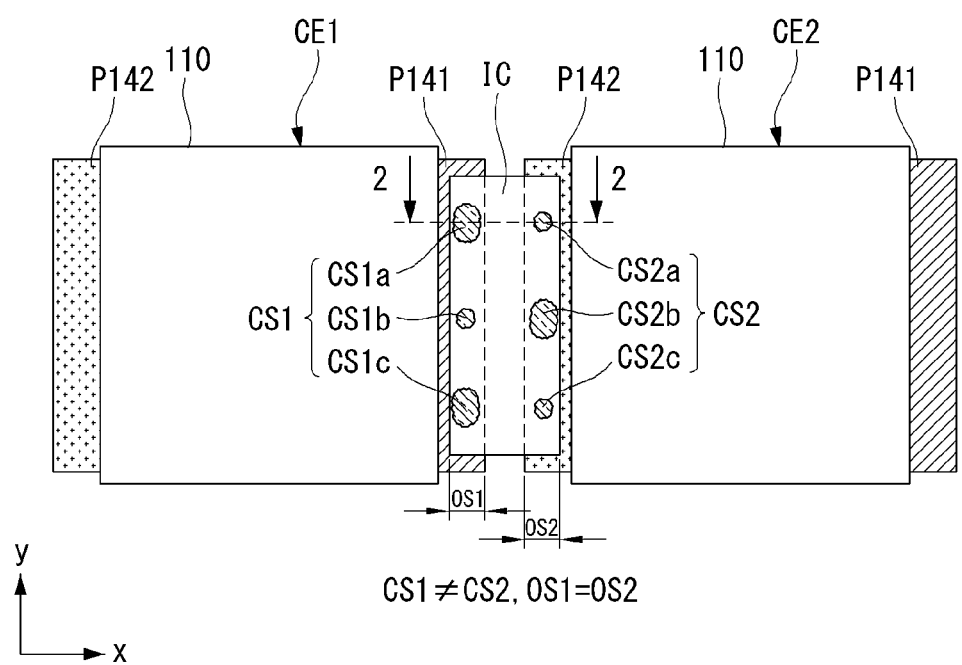
FIG. 1 is a plane view showing a first embodiment of a solar cell module according to the invention.
Figure 2A:
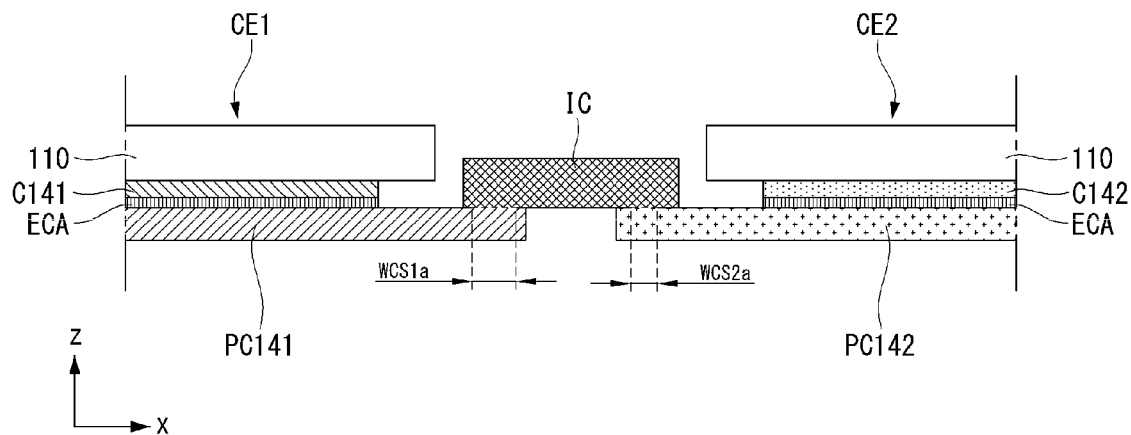
FIG. 2A shows an example of a cross-sectional view taken along line 2-2 of FIG. 1.
Figure 2B:
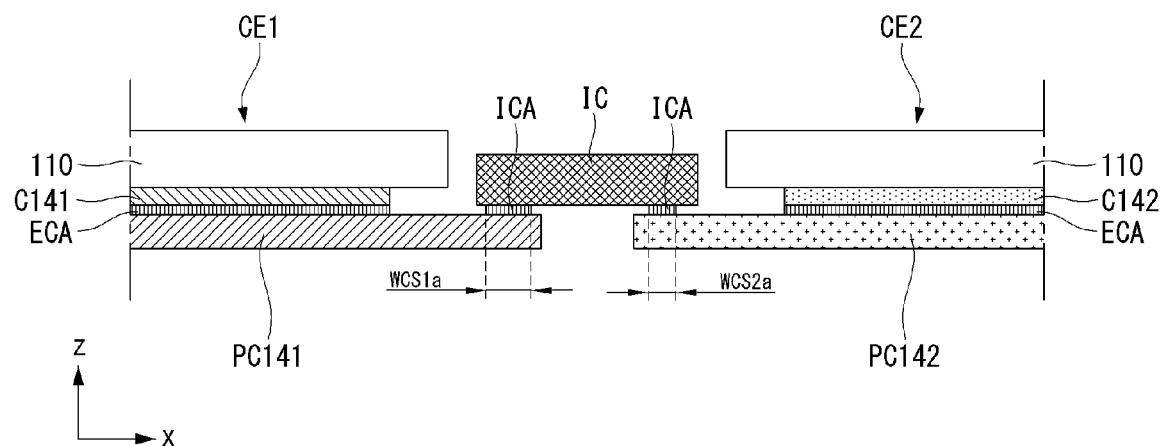
FIG. 2B shows another example of a cross-sectional view taken along line 2-2 of FIG. 1.

FIG. 1 is a plane view showing a first embodiment of a solar cell module according to the invention. FIG. 2A shows an example of a cross-sectional view taken along line 2-2 of FIG. 1, and FIG. 2B shows another example of a cross-sectional view taken along line 2-2 of FIG. 1.

As shown in FIGS. 1 and 2A, the first embodiment of the solar cell module according to the invention includes a first solar cell CE1, a second solar cell CE2, and an interconnector IC.

FIGS. 1 and 2A show that areas of connection portions between the interconnector IC and the first and second solar cells CE1 and CE2 are different from each other in a state where areas of overlap portions between the interconnector IC and the first and second solar cells CE1 and CE2 are the same as each other, as an example.

In the embodiment disclosed herein, each of the first and second solar cells CE1 and CE2 includes a semiconductor substrate 110, a plurality of first and second electrodes C141 and C142, which are formed on a back surface of the semiconductor substrate 110 and are separated from each other, a first conductive line P141 connected to the plurality of first electrodes C141, and a second conductive line P142 connected to the plurality of second electrodes C142. Although not shown in FIGS. 1 to 2B, in embodiments of the invention, an insulating member may be formed on back surfaces of the first and second conductive lines P141 and P142.

A solar cell applicable to the first and second solar cells CE1 and CE2 is described in detail later with reference to FIG. 6 and the drawings subsequent to FIG. 6.

The first and second solar cells CE1 and CE2 may be connected in series to each other through the interconnector IC and may be arranged in a first direction x. In the embodiment of the invention, the first direction x may be a longitudinal direction of the plurality of first and second electrodes C141 and C142 included in each of the first and second solar cells CE1 and CE2, and a second direction y may be a direction crossing the longitudinal direction of the plurality of first and second electrodes C141 and C142.

The interconnector IC electrically connects the first solar cell CE1 to the second solar cell CE2 in series. For example, as shown in FIG. 1, the interconnector IC may electrically connect the first conductive line P141 of the first solar cell CE1 to the second conductive line P142 of the second solar cell CE2. On the contrary, the interconnector IC may electrically connect the second conductive line P142 of the first solar cell CE1 to the first conductive line P141 of the second solar cell CE2.

The interconnector IC may contain a conductive material. For example, the interconnector IC may be formed of a material containing copper (Cu). In this instance, an anti-oxidation layer formed of tin (Sn) may be formed on the surface of the interconnector IC, so as to prevent the oxidation of copper (Cu).

As shown in FIG. 2A, in the solar cell module according to the invention, the interconnector IC may be directly connected to the first conductive line P141 of the first solar cell CE1 and the second conductive line P142 of the second solar cell CE2 without a separate interconnector adhesive.

For example, the interconnector IC may be directly connected to the first and second solar cells CE1 and CE2 through a local selective thermal method using a laser or an induction, or a sonic welding method, etc.

In the solar cell module according to the invention, at least one of an area OS1 of an overlap portion, an area CS1 of a connection portion, a connection position, and a connection shape between the interconnector IC and the first conductive line P141 of the first solar cell CE1 may be different from at least one of an area OS2 of an overlap portion, an area CS2 of a connection portion, a connection position, and a connection shape between the interconnector IC and the second conductive line P142 of the second solar cell CE2.

For example, as shown in FIG. 1, when a portion of the interconnector IC connected to the first conductive line P141 of the first solar cell CE1 is referred to as a first connection portion CS1, and a portion of the interconnector IC connected to the second conductive line P142 of the second solar cell CE2 is referred to as a second connection portion CS2, an area of the first connection portion CS1 may be different from an area of the second connection portion CS2 in the embodiment of the invention. In embodiments of the invention, each of the connection portions, such as the first connection portion CS1 and the second connection portion CS2 are attachment sites where bonding or attachment actually occurs between the interconnector IC and the conductive lines P141 and P142. Thus, the connection portions are areas or points of actual adhesion or bonding, and not simply areas or points of contact.

More specifically, as shown in FIG. 1, the interconnector IC may overlap the first and second conductive lines P141 and P142 of the first and second solar cells CE1 and CE2. For example, a first overlap width OS1 between the interconnector IC and the first conductive line P141 of the first solar cell CE1 in the first direction x may be the same as a second overlap width OS2 between the interconnector IC and the second conductive line P142 of the second solar cell CE2 in the first direction x. However, the first overlap width OS1 and the second overlap width OS2 may be different from each other.

In this instance, the first connection portion CS1 in an overlap portion between the interconnector IC and the first conductive line P141 of the first solar cell CE1 may be separated into a plurality of parts CS1a, CS1b, and CS1c in the second direction y crossing the first direction x. Further, the second connection portion CS2 in an overlap portion between the interconnector IC and the second conductive line P142 of the second solar cell CE2 may be separated into a plurality of parts CS2a, CS2b, and CS2c in the second direction y.

An area of the connection portion CS1a may be different from an area of the connection portion CS1b next to the connection portion CS1a, and also the area of the connection portion CS1b may be different from an area of the connection portion CS1c next to the connection portion CS1b, so as to further reduce a thermal expansion stress of the interconnector IC applied by the plurality of first connection portions CS1a, CS1b, and CS1c formed between the interconnector IC and the first solar cell CE1.

Further, in the plurality of second connection portions CS2a, CS2b, and CS2c formed between the interconnector IC and the second solar cell CE2, areas of the adjacent connection portions CS2a and CS2b may be different from each other, and also areas of the adjacent connection portions CS2b and CS2c may be different from each other.

Further, the total area of the plurality of first connection portions CS1a, CS1b, and CS1c may be different from the total area of the plurality of second connection portions CS2a, CS2b, and CS2c.

The interconnector IC may extend in the second direction y crossing the first direction x. The area of one (CS1a, for example) of the plurality of first connection portions CS1a, CS1b, and CS1c may be different from the area of one (CS2a, for example) of the plurality of second connection portions CS2a, CS2b, and CS2c, which is symmetrical to the first connection portion CS1a about a central line of the interconnector IC parallel to the second direction y. In embodiments of the invention, parts of the connection portions may be different from those that are adjacent thereto in at least one of the first direction x and the second direction y. For example, in FIG. 1, from the perspective of the part CS1a of the first connection portion CS1, the part CS2a of the second connection portion CS2 is adjacent thereto in the first direction x, and the part CS1b of the first connection portion CS1 is adjacent thereto in the second direction y. Thus, in FIG. 1, shown is the instance in which parts of the connection portions are different from those that are adjacent thereto in both the first direction x and the second direction y.

Further, in FIG. 1, shown is the instance in which the part CS1a of the first connection portion CS1 and the part CS2a of the second connection portion CS2 are positioned on the same line in the first direction x. However, they may be positioned on different lines and thus may be different from each other in the connection position.

As shown in FIG. 1, the part CS1a of the first connection portion CS1 may have an oval shape, and the part CS2a of the second connection portion CS2 may have a circular shape. Namely, they may be different from each other in the connection shape. In FIG. 1, shown is the instance in which the connection shape is the oval shape or the circular shape. However, examples of the connection shape may include a quadrangle, a rectangle, and a polygon. The connection shape of at least a portion of the first connection portion CS1 may be different from the connection shape of at least a portion of the second connection portion CS2.

Thus, as shown in FIG. 2A, a width WCS1a of the first connection portion CS1a in the first direction x may be different from a width WCS2a of the second connection portion CS2a in the first direction x. For example, the width WCS1a of the first connection portion CSla may be greater than the width WCS2a of the second connection portion CS2a.

FIG. 2A shows that the interconnector IC is directly connected to the first and second conductive lines P141 and P142 of the first and second solar cells CE1 and CE2, as an example. On the contrary, as shown in FIG. 2B, the interconnector IC may be connected to the first and second conductive lines P141 and P142 of the first and second solar cells CE1 and CE2 using an interconnector adhesive ICA formed of a conductive material.

The interconnector adhesive ICA may use a solder paste, a conductive paste, in which metal particles are included in an insulating resin, or a conductive film, etc. In addition, carbon nanotube (CNT), conductive particles containing carbon, a wire, a needle, etc., may be used for the interconnector adhesive ICA.

Even in this instance, an area of a first application portion CS1 of the interconnector adhesive ICA in a first overlap portion OS1 between the interconnector IC and the first conductive line P141 may be different from an area of a second application portion CS2 of the interconnector adhesive ICA in a second overlap portion OS2 between the interconnector IC and the second conductive line P142.

Even when the interconnector IC is connected to the first and second conductive lines P141 and P142 of the first and second solar cells CE1 and CE2 using the interconnector adhesive ICA, the first and second connection portions CS1 and CS2 may be configured in the same manner as FIG. 1.

Thus, the first application portion CS1 in the first overlap portion OS1 between the interconnector IC and the first conductive line P141 may be separated into a plurality of parts CS1a, CS1b, and CS1c in the second direction y. Further, the second application portion CS2 in the second overlap portion OS2 between the interconnector IC and the second conductive line P142 may be separated into a plurality of parts CS2a, CS2b, and CS2c in the second direction y. Even in this instance, the total area of the plurality of first application portions CS1a, CS1b, and CS1c may be different from the total area of the plurality of second application portions CS2a, CS2b, and CS2c.

As described above, the solar cell module according to the invention sets the areas of the first and second connection portions CS1 and CS2 to be different from each other and separates each of the first and second connection portions CS1 and CS2 into the plurality of parts, thereby further reducing the thermal expansion stress applied to the interconnector IC when the interconnector IC is connected to each solar cell.

Further, in the embodiment of the invention, as shown in FIG. 1, the areas of the plurality of connection portions CS1a, CS1b, CS1c, CS2a, CS2b, and CS2c of the interconnector IC arranged in the second direction y are different from one another. Hence, the thermal expansion stress applied to the interconnector IC may be further reduced.

Namely, the embodiment of the invention does not need to perform an alignment process for setting the areas of the first and second connection portions CS1 and CS2 to be the same as each other. Therefore, a design freedom may be further improved, and a connection process of the interconnector IC may be more easily performed.

FIG. 1 shows that the first overlap width OS1 between the interconnector IC and the first conductive line P141 is the same as the second overlap width OS2 between the interconnector IC and the second conductive line P142, as an example. However, the first overlap width OS1 and the second overlap width OS2 may be different from each other.

Figure 3:
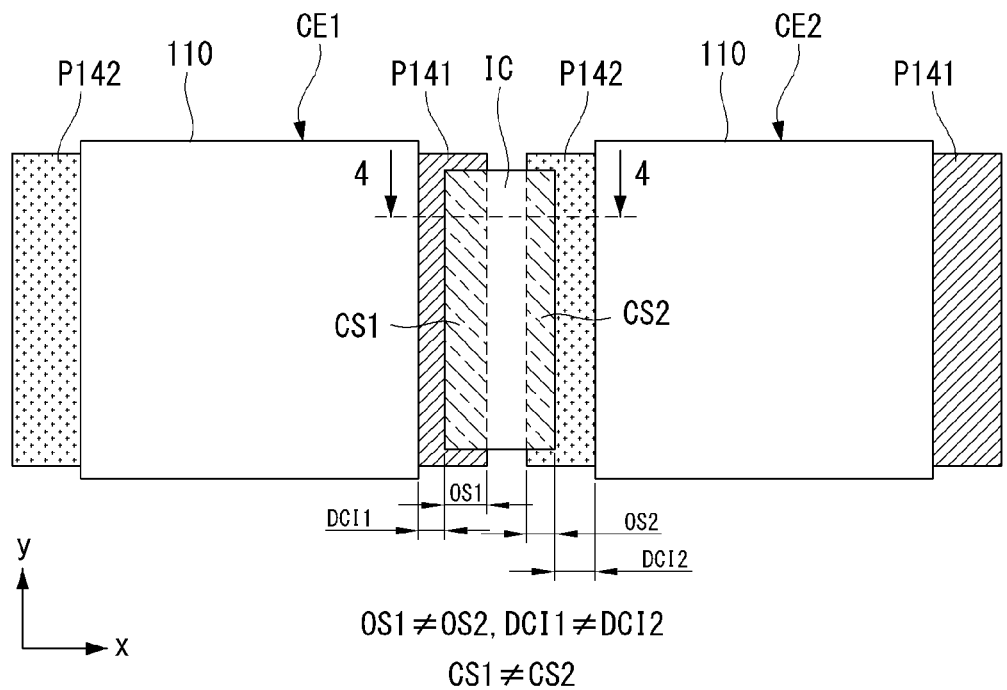
FIG. 3 is a plane view showing a second embodiment of a solar cell module according to the invention.
Figure 4:
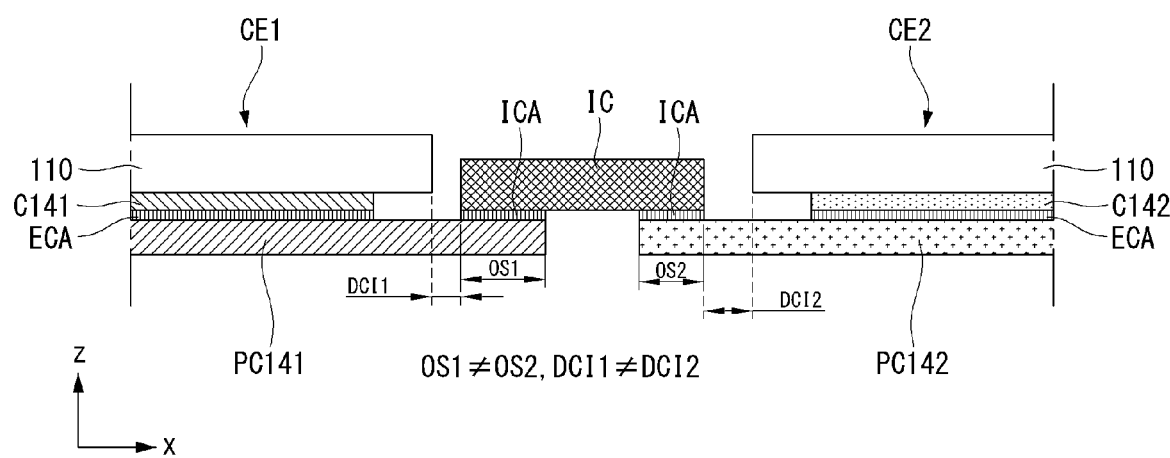
FIG. 4 is a cross-sectional view taken along line 4-4 of FIG. 3.

FIGS. 3 and 4 illustrate a second embodiment of the solar cell module according to the invention.

More specifically, FIG. 3 is a plane view showing the second embodiment of the solar cell module according to the invention, and FIG. 4 is a cross-sectional view taken along line 4-4 of FIG. 3. The description of structures and components identical or equivalent to those illustrated in FIGS. 1 to 2B is omitted in FIGS. 3 and 4, and a difference therebetween is mainly described.

FIGS. 3 and 4 show that connection areas between the interconnector IC and the first and second solar cells CE1 and CE2 are different from each other in a state of different overlap areas between the interconnector IC and the first and second solar cells CE1 and CE2, as an example.

As shown in FIG. 3, a first overlap area OS1 between the interconnector IC and the first conductive line P141 may be different from a second overlap area OS2 between the interconnector IC and the second conductive line P142.

For example, as shown in FIG. 3, the first overlap area OS1 may be greater than the second overlap area OS2.

For example, an overlap length between the interconnector IC and the first conductive line P141 in the second direction y may be the same as an overlap length between the interconnector IC and the second conductive line P142 in the second direction y. However, as shown in FIG. 4, a first overlap width OS1 between the interconnector IC and the first conductive line P141 in the first direction x may be different from a second overlap width OS2 between the interconnector IC and the second conductive line P142 in the first direction x. For example, the first overlap width OS1 may be greater than the second overlap width OS2.

For example, the first overlap width OS1 and the second overlap width OS2 may be 0.5 mm to 3 mm and may be set differently from each other within the above range.

A first separation distance DCI1 between the interconnector IC and the semiconductor substrate 110 included in the first solar cell CE1 may be different from a second separation distance DCl2 between the interconnector IC and the semiconductor substrate 110 included in the second solar cell CE2.

The interconnector IC and the first and second solar cells CE1 and CE2 may be connected to each other through an interconnector adhesive ICA using the entire overlap area therebetween as a connection portion. Thus, an area of a first connection portion CS1 of the interconnector IC connected to the first solar cell CE1 may be the same as the first overlap area OS1, and an area of a second connection portion CS2 of the interconnector IC connected to the second solar cell CE2 may be the same as the second overlap area OS2. Hence, the area of the first connection portion CS1 may be different from the area of the second connection portion CS2.

Further, each of the first and second connection portions CS1 and CS2 may be separated into a plurality of parts as shown in FIGS. 1 to 2B in a state where the first overlap area OS1 is different from the second overlap area OS2 as described above. This is described below with reference to FIG. 5.

Figure 5:
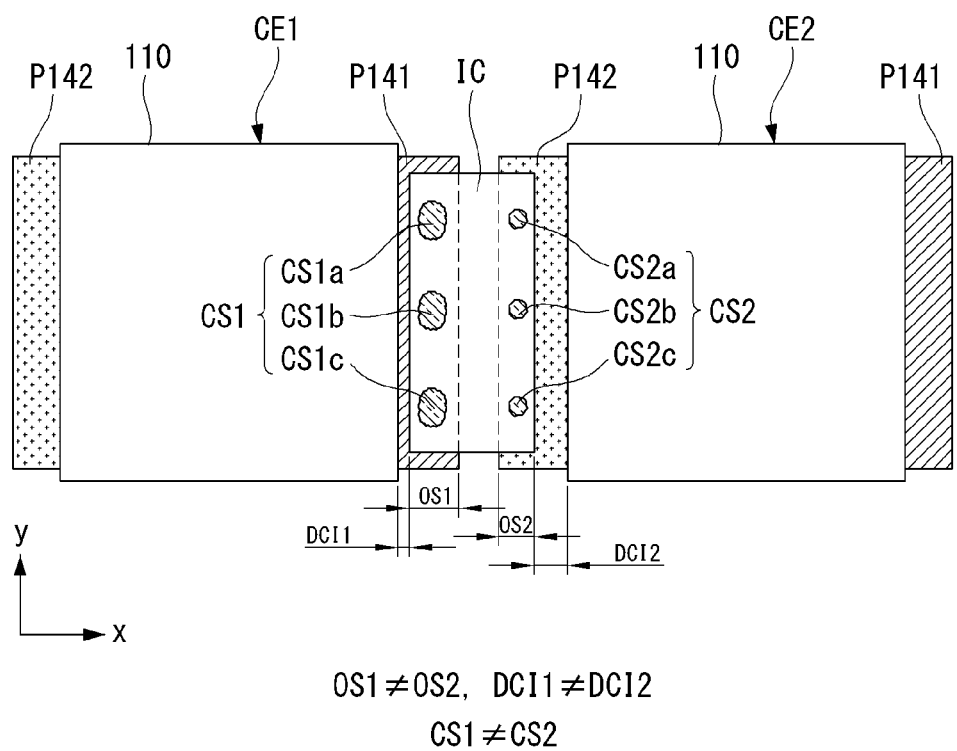
FIG. 5 shows a third embodiment of a solar cell module according to the invention.

FIG. 5 illustrates a third embodiment of the solar cell module according to the invention.

More specifically, FIG. 5 shows that each connection portion is separated into a plurality of parts in a state of the different overlap areas between the interconnector IC and the first and second solar cells CE1 and CE2.

As shown in FIG. 5, in the third embodiment of the solar cell module according to the invention, each of the first and second connection portions CS1 and CS2 may be separated into a plurality of parts in a state where the first and second overlap areas OS1 and OS2 between the interconnector IC and the first and second solar cells CE1 and CE2 are different from each other. In this instance, the total area of a plurality of first connection portions CS1$a$, CS1$b$, and CS1$c$ may be different from the total area of a plurality of second connection portions CS2$a$, CS2$b$, and CS2$c$.

Further, an area of each of the plurality of first connection portions in the first overlap area OS1 may be greater than an area of each of the plurality of second connection portions in the second overlap area OS2. In embodiments of the invention, parts of the connection portions may be different from those that are adjacent thereto in at least one of the first direction x and the second direction y. For example, in FIG. 5, from the perspective of the part CS1$a$ of the first connection portion CS1, the part CS2$a$ of the second connection portion CS2 is adjacent thereto in the first direction x, and the part CS1$b$ of the first connection portion CS1 is adjacent thereto in the second direction y. Thus, in FIG. 5, shown is the instance in which parts of the connection portions are different from those that are adjacent thereto in only the first direction x, but not in the second direction y.

An example of a solar cell applicable to the solar cell module according to the embodiments of the invention is described in detail below.

Figure 6:
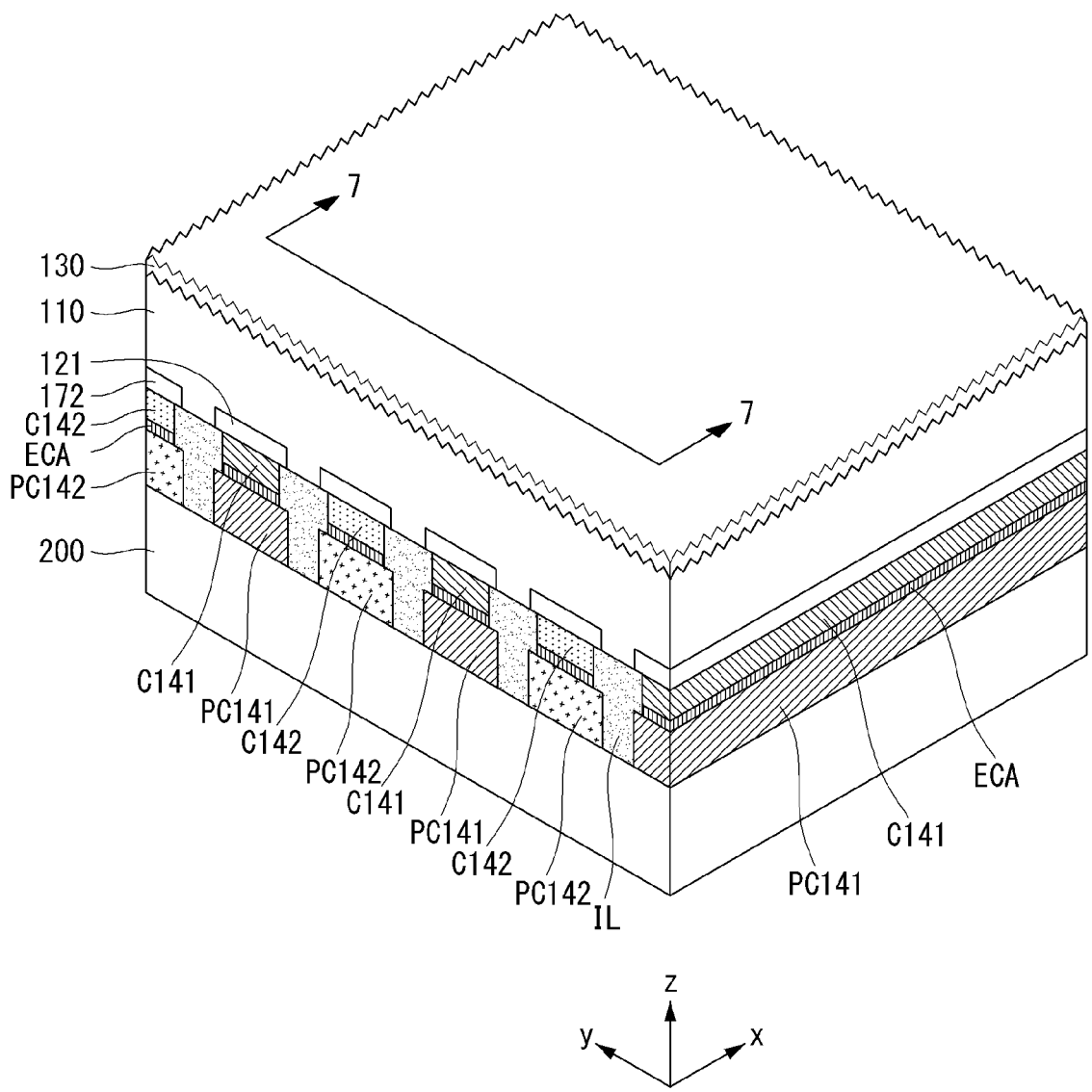
FIG. 6 is a partial perspective view of a solar cell according to an exemplary embodiment of the invention.
Figure 7:
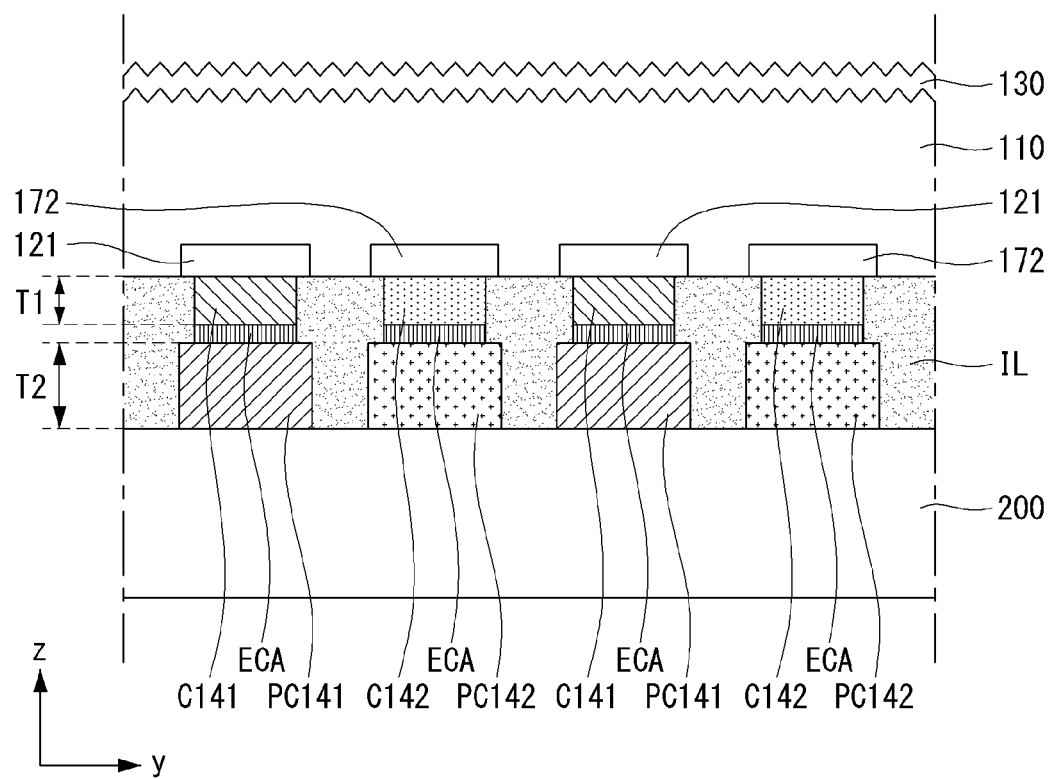
FIG. 7 is a cross-sectional view taken along line 7-7 of FIG. 6.
Figure 8:
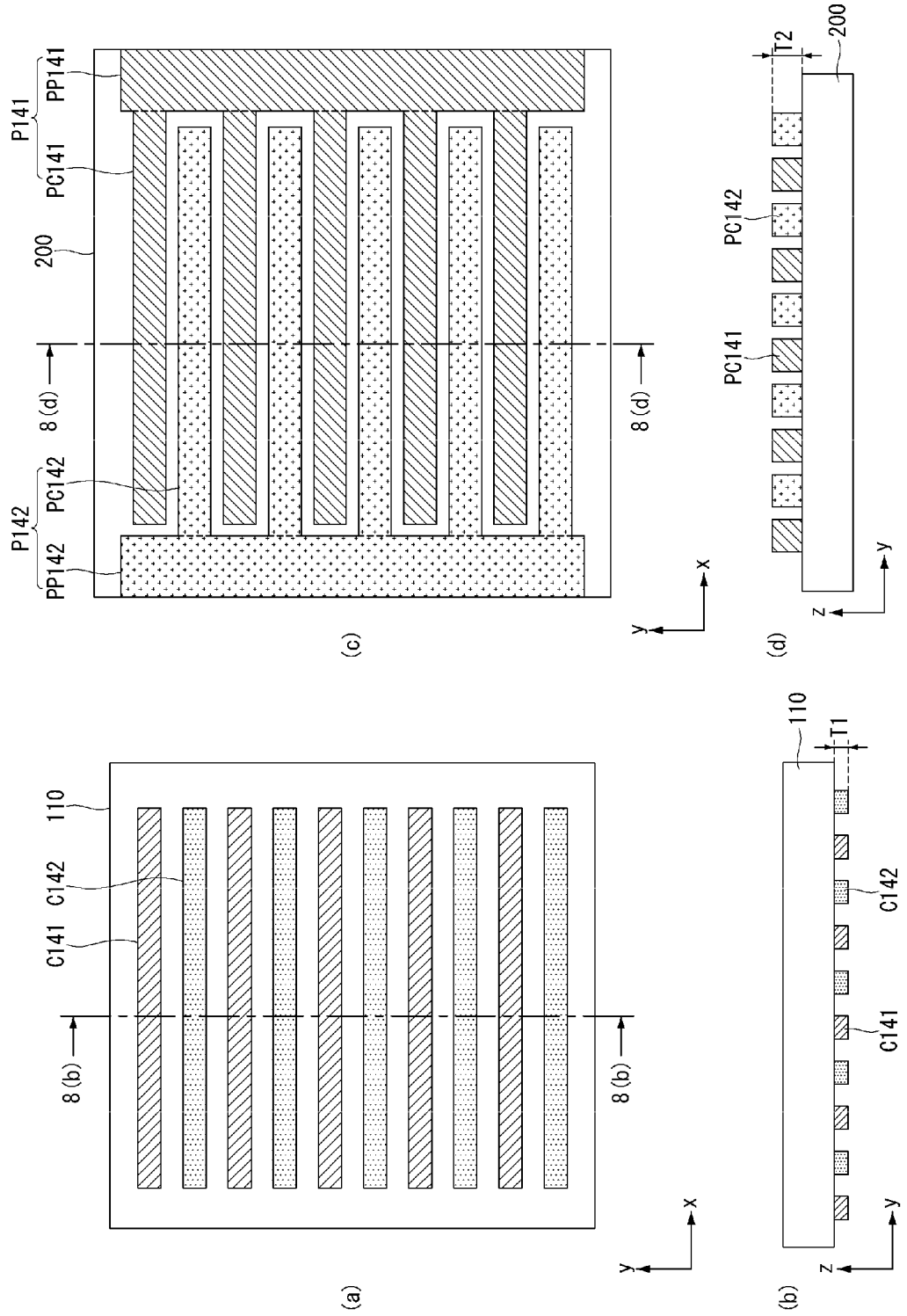
FIG. 8 shows an example of an electrode pattern of each of a semiconductor substrate and an insulating member, which will be connected to each other in a solar cell shown in FIGS. 6 and 7.

FIGS. 6 to 8 illustrate an example of a solar cell applicable to the solar cell module shown in FIGS. 1 to 5.

More specifically, FIG. 6 is a partial perspective view of a solar cell according to the embodiment of the invention. FIG. 7 is a cross-sectional view taken along line 7-7 of FIG. 6. FIG. 8 shows an example of an electrode pattern of each of a semiconductor substrate and an insulating member, which will be connected to each other in a solar cell shown in FIGS. 6 and 7.

In FIG. 8, (a) shows an example of a pattern of the first and second electrodes C141 and C142 disposed on a back surface of the semiconductor substrate 110; (b) is a cross-sectional view taken along line 8($b$)-8($b$) of (a) of FIG. 8; (c) shows an example of a pattern of the first and second conductive lines P141 and P142 disposed on a front surface of the insulating member 200; and (d) is a cross-sectional view taken along line 8($d$)-8($d$) of (c) of FIG. 8.

As shown in FIGS. 6 and 7, an example of the solar cell according to the embodiment of the invention may include a semiconductor substrate 110, an anti-reflection layer 130, an emitter region 121, a back surface field region 172, a plurality of first electrodes C141, a plurality of second electrodes C142, a first conductive line P141, a second conductive line P142, and an insulating member 200.

The anti-reflection layer 130 and the back surface field region 172 may be omitted in the embodiment of the invention, if necessary or desired. The solar cell according to the embodiment of the invention may further include a front surface field region positioned between the anti-reflection layer 130 and the surface of the semiconductor substrate 110, on which light is incident. The front surface field region may be a region which is more heavily doped than the semiconductor substrate 110 with impurities of the same conductive type as the semiconductor substrate 110.

In the following description, the embodiment of the invention is described using the solar cell including the anti-reflection layer 130 and the back surface field region 172 as an example.

The semiconductor substrate 110 may be a bulk type semiconductor substrate formed of silicon of a first conductive type, for example, an n-type, though not required. The semiconductor substrate 110 may be formed by doping a wafer formed of silicon material with impurities of the first conductive type.

The front surface of the semiconductor substrate 110 may be textured to form a textured surface corresponding to an uneven surface having a plurality of uneven portions or having uneven characteristics. The anti-reflection layer 130 may be positioned on the front surface of the semiconductor substrate 110, on which light is incident, and may include one layer or a plurality of layers. The anti-reflection layer 130 may be formed of hydrogenated silicon nitride (SiNx:H). Further, the front surface field region may be additionally formed at the front surface of the semiconductor substrate 110.

The emitter region 121 may be separated from one another inside a back surface opposite the front surface of the semiconductor substrate 110 and may extend in a direction parallel to one another. Namely, the emitter region 121 may be in the plural. The plurality of emitter regions 121 may contain impurities of a second conductive type (for example, p-type) opposite the first conductive type (for example, n-type) of the semiconductor substrate 110.

More specifically, the plurality of emitter regions 121 may heavily contain impurities of the second conductive type (for example, p-type) opposite the first conductive type (for example, n-type) of the semiconductor substrate 110 formed of crystalline silicon and may be formed through a diffusion process.

The plurality of back surface field regions 172 may be positioned inside the back surface of the semiconductor substrate 110. The plurality of back surface field regions 172 may be separated from one another in a direction parallel to the plurality of emitter regions 121 and may extend in the same direction as the emitter regions 121. Thus, as shown in FIGS. 6 and 7, the plurality of emitter regions 121 and the plurality of back surface field regions 172 may be alternately positioned at the back surface of the semiconductor substrate 110.

Each back surface field region 172 may be a region (for example, an $n^{++}$-type region) which is more heavily doped than the semiconductor substrate 110 with impurities of the same conductive type as the semiconductor substrate 110. The plurality of back surface field regions 172 may heavily contain impurities (for example, $n^{++}$-type impurities) of the same conductive type as the semiconductor substrate 110 formed of crystalline silicon and may be formed through a diffusion process or a deposition process.

The plurality of first electrodes C141 are physically and electrically connected to the plurality of emitter regions 121, respectively, extend along the plurality of emitter regions 121, and are separated from one another. Thus, when the emitter regions 121 extend in the first direction x, the first electrodes C141 may extend in the first direction x. Further, when the emitter regions 121 extend in the second direction y, the first electrodes C141 may extend in the second direction y.

The plurality of second electrodes C142 are physically and electrically connected to the semiconductor substrate 110 through the plurality of back surface field regions 172 and extend along the plurality of back surface field regions 172.

Thus, when the back surface field regions 172 extend in the first direction x, the second electrodes C142 may extend in the first direction x. Further, when the back surface field regions 172 extend in the second direction y, the second electrodes C142 may extend in the second direction y.

The first electrodes C141 and the second electrodes C142 are physically separated from each other and are electrically insulated from each other on the back surface of the semiconductor substrate 110.

Thus, the first electrode C141 formed on the emitter region 121 may collect carriers (for example, holes) moving to the emitter region 121, and the second electrode C142 formed on the back surface field region 172 may collect carriers (for example, electrons) moving to the back surface field region 172.

As shown in FIG. 8, the first conductive line P141 may include a plurality of first connectors PC141 and a first pad PP141. As shown in FIGS. 6 and 7, the first connectors PC141 may be connected to the plurality of first electrodes C141. Further, as shown in FIG. 8, one side of the first pad PP141 may be connected to ends of the first connectors PC141, and the other side may be connected to the interconnector IC.

The plurality of first connectors PC141 may be respectively connected to the plurality of first electrodes C141. On the contrary, the first connector PC141 may be configured as one sheet electrode. In this instance, the plurality of first electrodes C141 may be connected to the sheet type first connector PC141.

When the plurality of first connectors PC141 are provided, the first connectors PC141 may be formed in the same direction as the first electrodes C141 and also may be formed in a direction crossing the first electrodes C141. The first connectors PC141 and the first electrode C141 may be electrically connected to each other in an overlap portion therebetween.

As shown in FIG. 8, the second conductive line P142 may include a plurality of second connectors PC142 and a second pad PP142. As shown in FIGS. 6 and 7, the second connectors PC142 may be connected to the plurality of second electrodes C142. Further, as shown in FIG. 8, one side of the second pad PP142 may be connected to ends of the second connectors PC142, and the other side may be connected to the interconnector IC.

The plurality of second connectors PC142 may be respectively connected to the plurality of second electrodes C142. On the contrary, the second connector PC142 may be configured as one sheet electrode. In this instance, the plurality of second electrodes C142 may be connected to the sheet type second connector PC142.

When the plurality of second connectors PC142 are provided, the second connectors PC142 may be formed in the same direction as the second electrodes C142 and also may be formed in a direction crossing the second electrodes C142. The second connectors PC142 and the second electrode C141 may be electrically connected to each other in an overlap portion therebetween.

The first conductive line P141 and the second conductive line P142 may be formed of at least one of copper (Cu), gold (Au), silver (Ag), or aluminum (Al).

As shown in FIG. 7, the first conductive line P141 may be electrically connected to the first electrodes C141 using an electrode adhesive ECA formed of a conductive material, and the second conductive line P142 may be electrically connected to the second electrodes C142 using the electrode adhesive ECA.

The material of the electrode adhesive ECA is not particularly limited as long as it is a conductive material. However, it may be preferable, but not required, that a conductive material having a melting point of a relatively low temperature, for example, about 140° C. to 180° C. is used. However, the embodiment of the invention is not limited thereto. The melting point may vary.

For example, the electrode adhesive ECA may use a solder paste, a conductive paste, in which conductive metal particles are included in an insulating resin, or a conductive adhesive film.

Further, an insulating layer IL may be positioned between the first electrode C141 and the second electrode C142 and between the first conductive line P141 and the second conductive line P142, thereby preventing the short circuit. The insulating layer IL may include an insulating resin, such as epoxy.

FIGS. 6 and 7 show that the first electrode C141 overlaps the first connector PC141 of the first conductive line P141, and the second electrode C142 overlaps the second connector PC142 of the second conductive line P142, as an example. On the contrary, the first electrode C141 may overlap the second connector PC142 of the second conductive line P142, and the second electrode C142 may overlap the first connector PC141 of the first conductive line P141. In this instance, the insulating layer IL for preventing the short circuit may be positioned between the first electrode C141 and the second connector PC142 and between the second electrode C142 and the first connector PC141.

The insulating member 200 may be disposed on the back surfaces of the first conductive line P141 and the second conductive line P142.

A material of the insulating member 200 is not particularly limited as long as it is an insulating material. However, it may be preferable, but not required, that the material of the insulating member 200 has a relatively high melting point. For example, the insulating member 200 may be formed of at least one of polyimide, epoxy-glass, polyester, or bismaleimide triazine (BT) resin, each of which has a thermal resistance to a high temperature.

The insulating member 200 may be formed in the form of a flexible film or in the form of a hard plate which is not flexible.

In the solar cell according to the embodiment of the invention, each insulating member 200 and each semiconductor substrate 110 may be connected to each other to form an individual element in a state where the first and second conductive lines P141 and P142 are previously formed on the front surface of the insulating member 200 and the first and second electrodes C141 and C142 are previously formed on the back surface of the semiconductor substrate 110.

Namely, only one semiconductor substrate 110 may be attached and connected to one insulating member 200. In other words, one semiconductor substrate 110 and one insulating member 200 may be attached to each other to form an individual integrated type element, thereby forming a solar cell.

More specifically, the plurality of first electrodes C141 and the plurality of second electrodes C142 formed on the back surface of one semiconductor substrate 110 may be attached and electrically connected to the first conductive line P141 and the second conductive line P142 formed on the front surface of one insulating member 200 through a process for attaching one semiconductor substrate 110 to one insulating member 200 to form one individual integrated type element.

In the solar cell according to the embodiment of the invention, a thickness T2 of each of the first conductive line P141 and the second conductive line P142 may be greater than a thickness T1 of each of the first electrode C141 and the second electrode C142.

When the thickness T2 of each of the first connector PC141 and the second connector PC142 is greater than the thickness T1 of each of the first electrode C141 and the second electrode C142, a process time required to manufacture the solar cell may be further reduced, and the thermal expansion stress of the semiconductor substrate 110 may be further reduced than when the first electrode C141 and the second electrode C142 are directly formed on the back surface of the semiconductor substrate 110. Hence, the efficiency of the solar cell may be further improved.

The insulating member 200 functions to facilitate the process performed when the first conductive line P141 and the second conductive line P142 are respectively attached to the first electrodes C141 and the second electrodes C142 formed on the back surface of the semiconductor substrate 110.

Namely, when the front surface of the insulating member 200, on which the first conductive line P141 and the second conductive line P142 are formed, is attached and connected to the back surface of the semiconductor substrate 110, on which the first electrodes C141 and the second electrodes C142 are formed, through the semiconductor manufacturing process, the insulating member 200 may help in more easily performing an alignment process or a connection process.

Thus, after the first and second conductive lines P141 and P142 are respectively connected to the first and second electrodes C141 and C142 through the connection process, the insulating member 200 may be removed. Thus, the insulating member 200 may be omitted in the completed solar cell. In the following description, the embodiment of the invention is described using the solar cell including the insulating member 200 as an example.

In the solar cell having the above-described structure according to the embodiment of the invention, holes collected through the first conductive line P141 and electrons collected through the second conductive line P142 may be used as electric power of an external device through an external circuit device.

So far, the embodiment of the invention described that the semiconductor substrate 110 is the crystalline silicon semiconductor substrate, and the emitter region 121 and the back surface field region 172 are formed through the diffusion process, as an example.

On the contrary, the embodiment of the invention may be equally applied to a heterojunction solar cell configured such that an emitter region and a back surface field region, each of which is formed of amorphous silicon, are formed on a crystalline silicon semiconductor substrate, or a solar cell configured such that an emitter region is formed on a front surface of a semiconductor substrate and is connected to a first electrode formed on a back surface of the semiconductor substrate through a plurality of via holes of the semiconductor substrate.

The plurality of solar cells each having the above-described structure may be connected in series to one another through the interconnector IC.

In the solar cell having the above-described structure, a pattern of the first and second electrodes C141 and C142 formed on the back surface of the semiconductor substrate 110 and a pattern of the first and second conductive lines P141 and P142 formed on the front surface of the insulating member 200 are described in detail below.

The front surface of the insulating member 200 having the structure shown in (c) and (d) of FIG. 8 may be attached and connected to the back surface of the semiconductor substrate 110 having the structure shown in (a) and (b) of FIG. 8, thereby forming the individual integrated type element. Namely, the insulating member 200 and the semiconductor substrate 110 may have one-to-one connection.

In this instance, as shown in (a) and (b) of FIG. 8, the plurality of first electrodes C141 and the plurality of second electrodes C142 may be separated from each other on the back surface of the semiconductor substrate 110 and may extend in the first direction x.

Further, as shown in (c) and (d) of FIG. 8, the first conductive line P141 and the second conductive line P142 may be formed on the front surface of the insulating member 200.

As described above, the first conductive line P141 may include the first connectors PC141 and the first pad PP141. As shown in (c) of FIG. 8, the first connectors PC141 may extend in the first direction x, and the first pad PP141 may extend in the second direction y. One side of the first pad PP141 may be connected to the ends of the first connectors PC141, and the other side may be connected to the interconnector IC.

Further, the second conductive line P142 may include the second connectors PC142 and the second pad PP142. As shown in (c) of FIG. 8, the second connectors PC142 may be separated from the first connectors PC141 and may extend in the first direction x, and the second pad PP142 may extend in the second direction y. One side of the second pad PP142 may be connected to the ends of the second connectors PC142, and the other side may be connected to the interconnector IC.

In the embodiment disclosed herein, the first connectors PC141 may be separated from the second pad PP142, and the second connectors PC142 may be separated from the first pad PP141.

Accordingly, the first pad PP141 may be formed at one end of the front surface of the insulating member 200 in the first direction x, and the second pad PP142 may be formed at the other end of the insulating member 200.

As described above, the solar cell according to the embodiment of the invention may form an individual integrated type element by attaching only one insulating member 200 to one semiconductor substrate 110, thereby more easily performing a manufacturing process of the solar cell module. Further, even if the semiconductor substrate 110 included in any one solar cell is broken or damaged in the manufacturing process of the solar cell module, only the corresponding solar cell forming the individual integrated type element using the broken or damaged semiconductor substrate 110 may be replaced. Hence, the process yield of the solar cell module may be further improved.

Further, the solar cell forming the individual integrated type element may minimize the thermal expansion stress applied to the semiconductor substrate 110 when the solar cell or the solar cell module is manufactured.

When an area of the insulating member 200 is equal to or greater than an area of the semiconductor substrate 110, a formation space of the interconnector IC for connecting the adjacent solar cells may be sufficiently secured in the front surface of the insulating member 200. Thus, the area of the insulating member 200 may be greater than the area of the semiconductor substrate 110.

For this, a length of the insulating member 200 in the first direction x may be longer than a length of the semiconductor substrate 110 in the first direction x.

In the embodiment disclosed herein, the front surface of the insulating member 200 may be attached to the back surface of the semiconductor substrate 110. Hence, the first electrodes C141 may be connected to the first conductive line P141, and the second electrodes C142 may be connected to the second conductive line P142.

Figure 9:
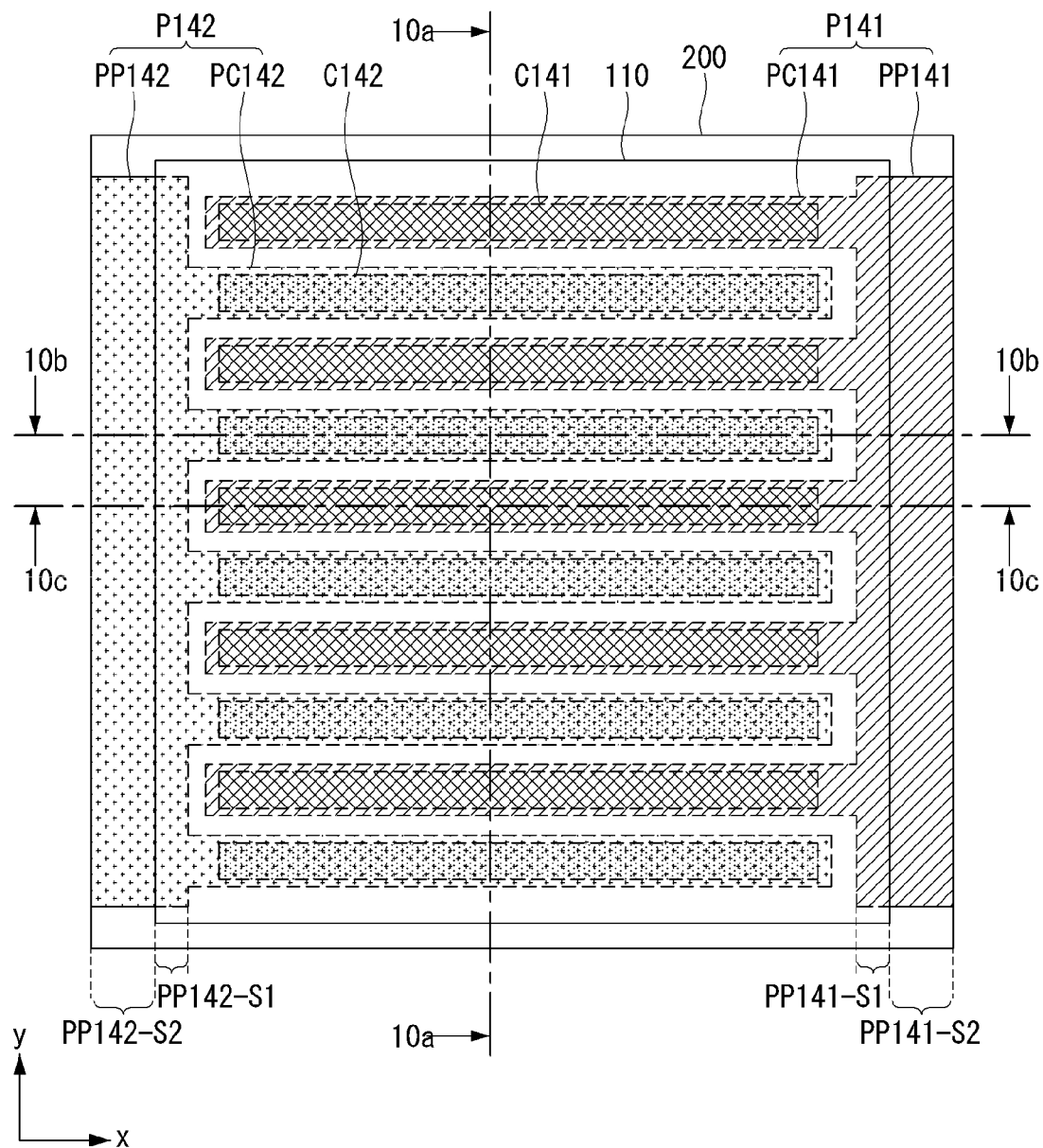
FIG. 9 shows a state where a semiconductor substrate and an insulating member shown in FIG. 8 are connected to each other.
Figure 10A:
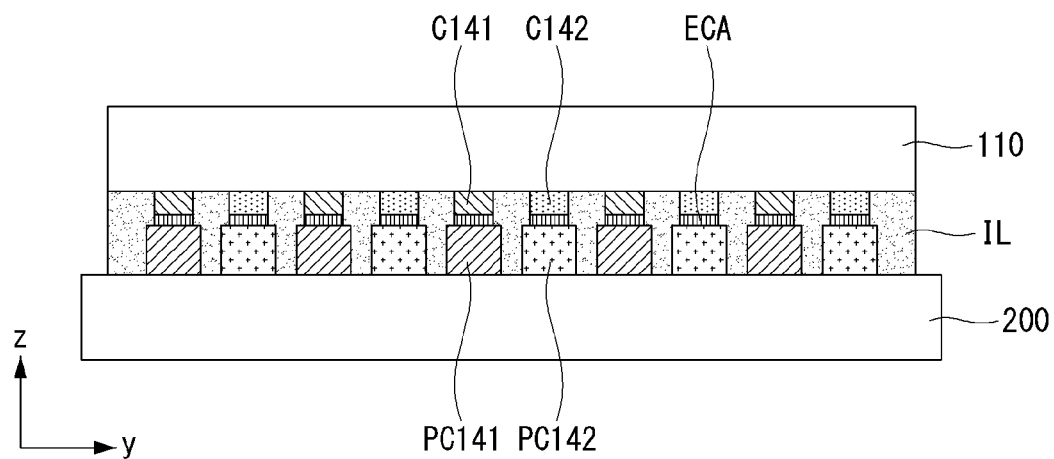
FIG. 10A is a cross-sectional view taken along line 10a-10a of FIG. 9.
Figure 10B:
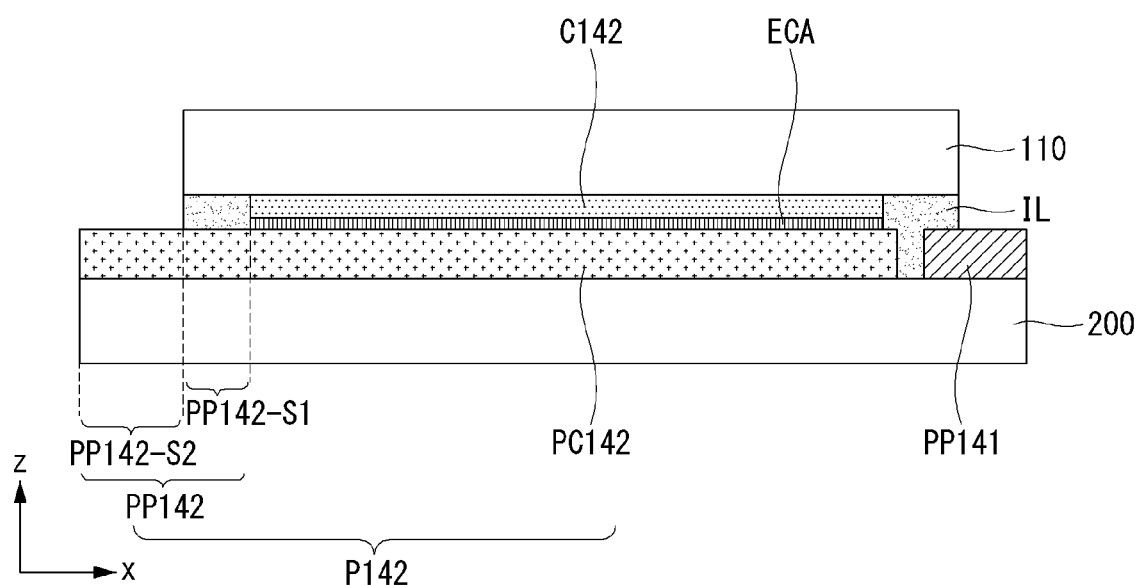
FIG. 10B is a cross-sectional view taken along line 10b-10b of FIG. 9.
Figure 10C:
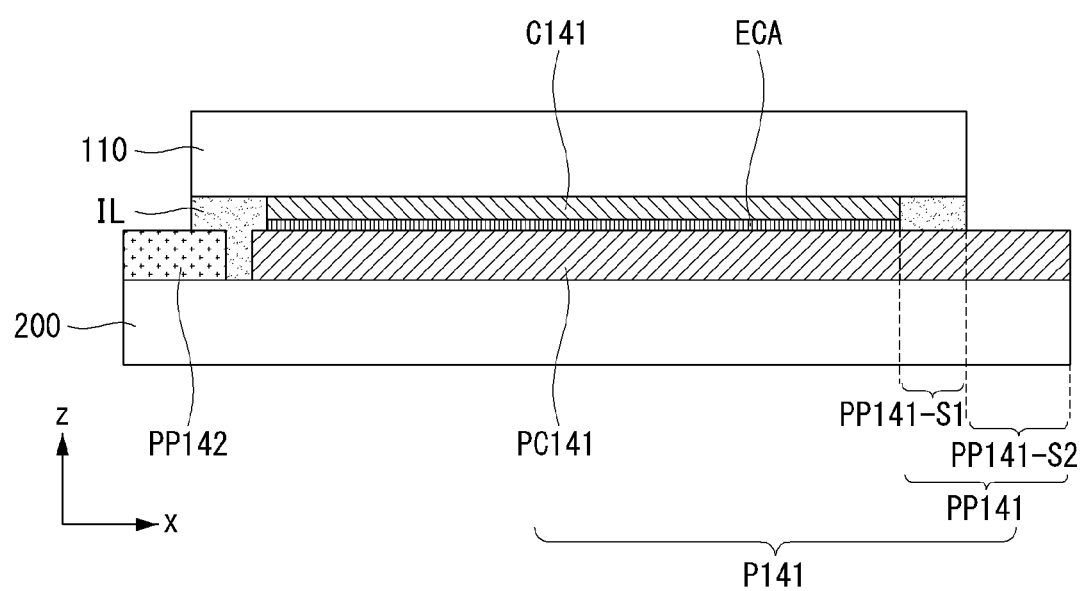
FIG. 10C is a cross-sectional view taken along line 10c-10c of FIG. 9.

FIG. 9 shows a state where the semiconductor substrate and the insulating member shown in FIG. 8 are connected to each other. FIG. 10A is a cross-sectional view taken along line 10a-10a of FIG. 9, FIG. 10B is a cross-sectional view taken along line 10b-10b of FIG. 9, and FIG. 10C is a cross-sectional view taken along line 10c-10c of FIG. 9.

As shown in FIG. 9, one semiconductor substrate 110 may completely overlap one insulating member 200 to form an individual solar cell element.

For example, as shown in FIG. 10A, the first electrode C141 formed on the back surface of the semiconductor substrate 110 and the first connector PC141 formed on the front surface of the insulating member 200 may overlap each other and may be electrically connected to each other using the electrode adhesive ECA.

Further, the second electrode C142 formed on the back surface of the semiconductor substrate 110 and the second connector PC142 formed on the front surface of the insulating member 200 may overlap each other and may be electrically connected to each other using the electrode adhesive ECA.

A space between the first electrode C141 and the second electrode C142 may be filled with the insulating layer IL, and also a space between the first connector PC141 and the second connector PC142 may be filled with the insulating layer IL.

As shown in FIG. 10B, a space between the second connector PC142 and the first pad PP141 may be filled with the insulating layer IL. As shown in FIG. 10C, a space between the first connector PC141 and the second pad PP142 may be filled with the insulating layer IL.

As shown in FIG. 9, the first pad PP141 and the second pad PP142 may respectively include first areas PP141-S1 and PP142-S1 overlapping the semiconductor substrate 110 and second areas PP141-S2 and PP142-S2 not overlapping the semiconductor substrate 110.

The interconnector IC may be connected to the second area PP141-S2 of the first pad PP141 and the second area PP142-S2 of the second pad PP142, which are provided to secure a connection space of the interconnector IC.

Because the first pad PP141 and the second pad PP142 according to the embodiment of the invention respectively include the second areas PP141-S2 and PP142-S2, the connection of the interconnector IC may be more easily performed. Further, when the interconnector IC is connected to the insulating member 200, the thermal expansion stress of the semiconductor substrate 110 may be minimized.

Thus, the interconnector IC may be connected to the first pad PP141 or the second pad PP142 of the insulating member 200, thereby connecting the plurality of solar cells.

So far, the embodiment of the invention described that the first and second electrodes C141 and C142 formed on the semiconductor substrate 110 and the first and second connectors PC141 and PC142 formed on the insulating member 200 overlap each other and are connected to each other in a direction parallel to each other. On the contrary, the first and second electrodes C141 and C142 formed on the semiconductor substrate 110 and the first and second connectors PC141 and PC142 formed on the insulating member 200 may overlap each other and may be connected to each other in a cross direction therebetween.

Further, each of the first and second connectors PC141 and PC142 is not formed in the plural and may be configured as one sheet electrode. In this instance, the plurality of first electrodes C141 may be connected to the sheet electrode type first connector PC141, and the plurality of second electrodes C142 may be connected to the sheet electrode type second connector PC142.

So far, the embodiment of the invention described one first pad PP141 and one second pad PP142, as an example. On the contrary, each of the first pad PP141 and the second pad PP142 may be in the plural. In this instance, the plurality of first connectors PC141 and the plurality of second connectors PC142 may be connected to the plurality of first pads PP141 and the plurality of second pads PP142.

Further, FIGS. 6 to 10C show the solar cell according to the embodiment of the invention including the insulating member 200, as an example. On the contrary, after the first and second electrodes C141 and C142 are connected to the first and second conductive lines P141 and P142, the insulating member 200 may be removed. The interconnector IC may be connected to the first conductive line P141 or the second conductive line P142 in a state where the insulating member 200 is removed.

Further, so far, in FIGS. 1 to 10C, shown is the instance in which the longitudinal direction of the first and second electrodes C141 and C142 of each solar cell is the same as the longitudinal direction (i.e., the longitudinal direction of the first and second connectors PC141 and PC142) of the first and second conductive lines P141 and P142.

However, the solar cell module, in which the longitudinal direction of the first and second electrodes C141 and C142 crosses the longitudinal direction of the first and second conductive lines P141 and P142, is described below.

FIGS. 11 to 15B illustrate a solar cell module, in which each of the first and second conductive lines is configured as a plurality of wires.

The description of structures and components identical or equivalent to those illustrated in FIGS. 1 to 10C is omitted in FIGS. 11 to 15B, and a difference therebetween is mainly described.

Figure 11:
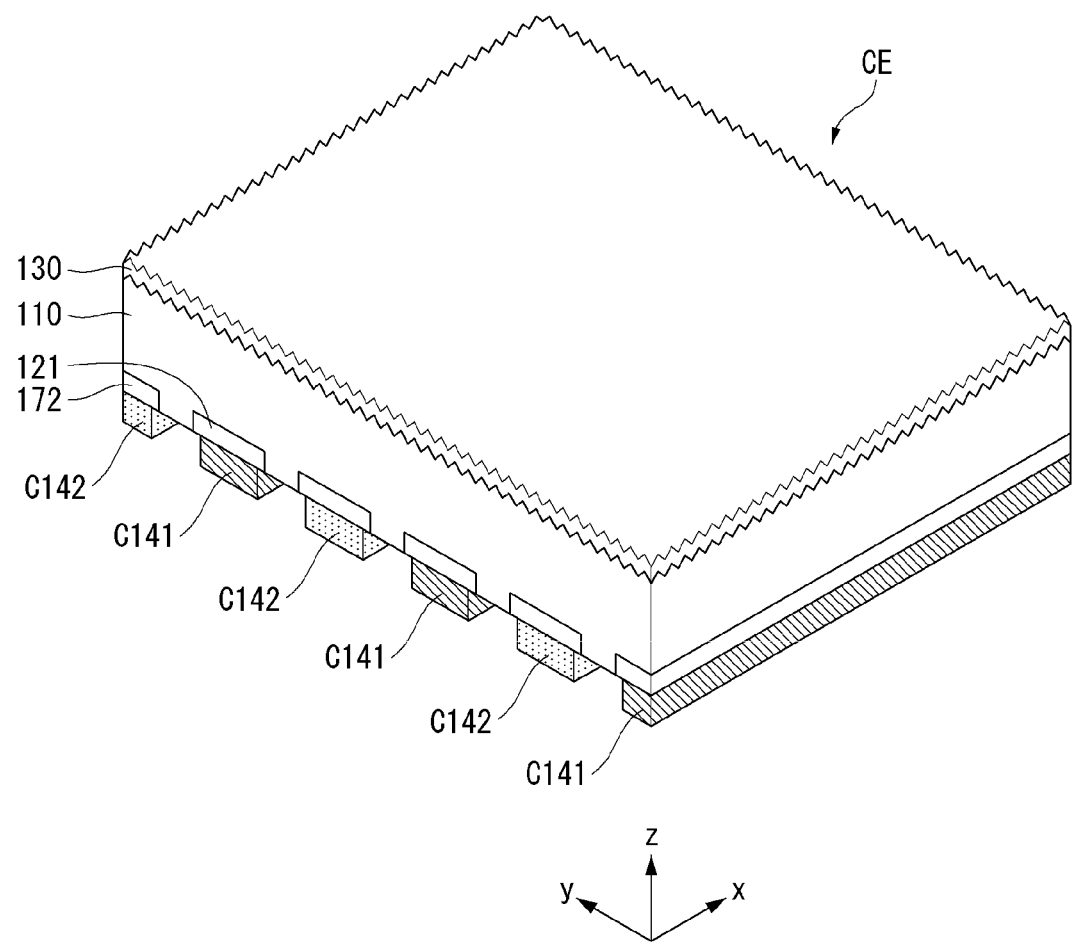
Figure 12:
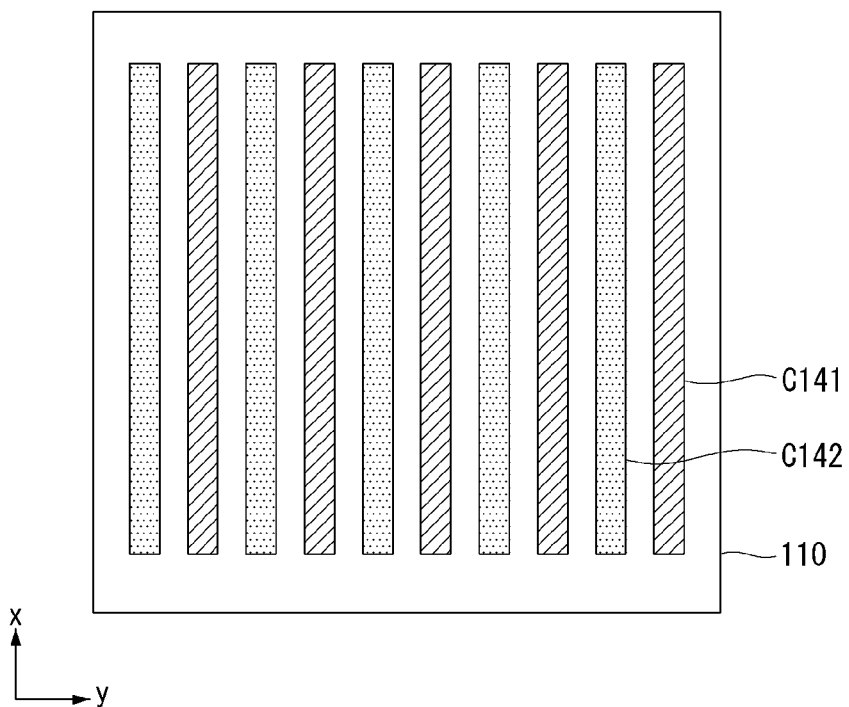

FIGS. 11 and 12 show an example of a solar cell applied when the first and second conductive lines P141 and P142 of the solar cell module according to the embodiment of the invention are configured as the plurality of wires. More specifically, FIG. 11 is a partial perspective view of a solar cell, and FIG. 12 shows a pattern of the first and second electrodes C141 and C142 formed on a back surface of the solar cell shown in FIG. 11.

Figure 13:
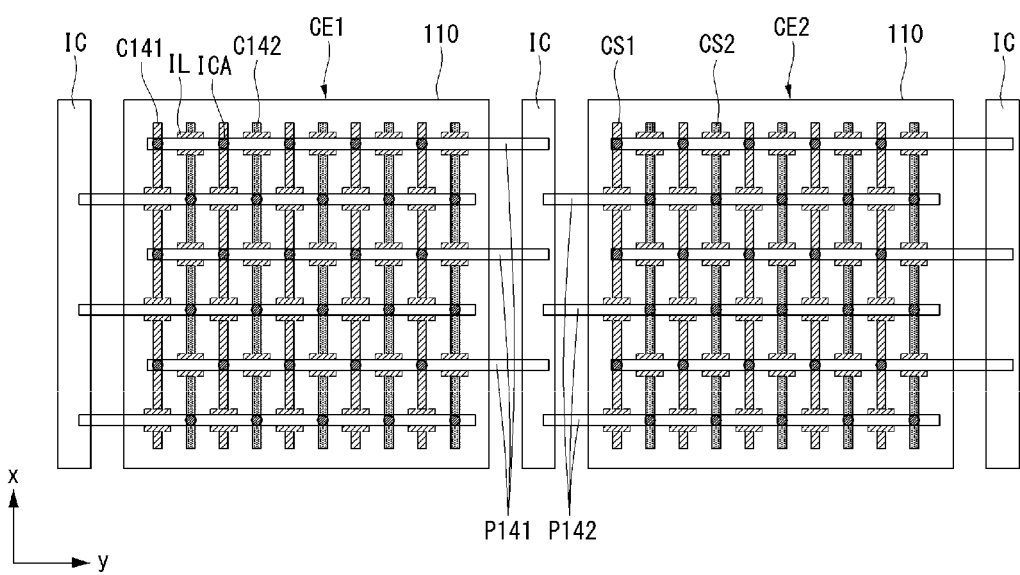

FIG. 13 shows an example where the first and second conductive lines P141 and P142 configured as the plurality of wires are connected to each other through the interconnector IC at the back surface of the solar cell shown in FIGS. 11 and 12. FIG. 14 shows a difference between areas of connection portions of the first and second conductive lines P141 and P142 and the interconnector IC.

Figure 15A:
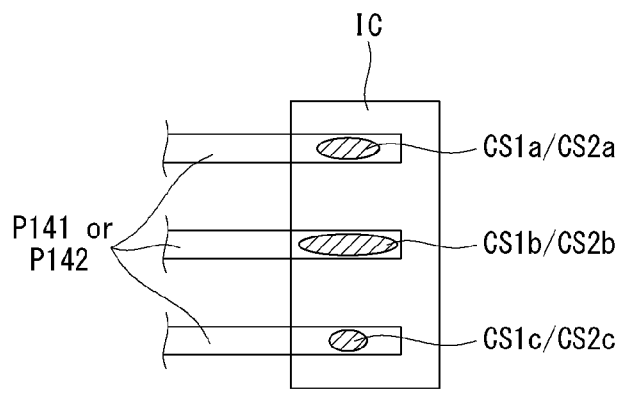
Figure 15B:
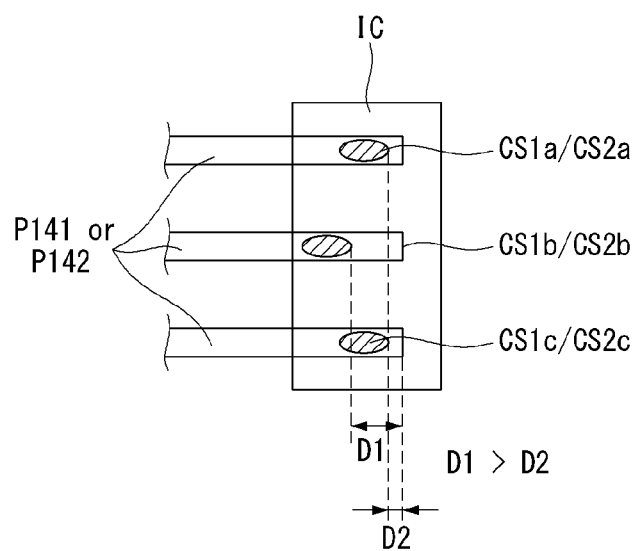

FIGS. 15A and 15B illustrate connection portions and connection positions between a plurality of wires included in the first and second conductive lines P141 and P142 and the interconnector IC.

As shown in FIG. 11, a solar cell applicable to the solar cell module according to the embodiment of the invention may include a semiconductor substrate 110, an anti-reflection layer 130, an emitter region 121, a back surface field region 172, a plurality of first electrodes C141, and a plurality of second electrodes C142.

As shown in FIG. 12, the plurality of first and second electrodes C141 and C142 may be alternately arranged and may extend in the first direction x. Since the semiconductor substrate 110, the anti-reflection layer 130, the emitter region 121, the back surface field region 172, and the first and second electrodes C141 and C142 are described above with reference to FIGS. 6 to 10C, a further description may be briefly made or may be entirely omitted.

As shown in FIG. 13, each of first and second conductive lines P141 and P142 may be configured as a plurality of wires, unlike FIGS. 6 to 10C.

As shown in FIG. 13, each of the first and second conductive lines P141 and P142 configured as the plurality of wires may extend in a direction (i.e., the second direction y) crossing a longitudinal direction of the first and second electrodes C141 and C142 formed on the back surface of the solar cell. However, an extension direction of the first and second conductive lines P141 and P142 is not limited thereto.

The first and second electrodes C141 and C142 included in each of the first and second solar cells CE1 and CE2 may extend in the first direction x, and the first and second solar cells CE1 and CE2 may be arranged in a line along the second direction y crossing the first direction x. Further, each of the first and second conductive lines P141 and P142 configured as the plurality of wires may extend in the second direction y.

Thus, the first and second conductive lines P141 and P142 and the first and second electrodes C141 and C142 may be connected to each other or insulated from each other in a portion used in the series connection of the first and second solar cells CE1 and CE2 among a cross and overlap portion therebetween.

An electrode adhesive ECA may be used to connect the first and second conductive lines P141 and P142 to the first and second electrodes C141 and C142. More specifically, in FIG. 13, in each of the first and second solar cells CE1 and CE2, the electrode adhesive ECA may be positioned between the first conductive line P141 and the first electrode C141 and between the second conductive line P142 and the second electrode C142, thereby connecting the first conductive line P141 to the first electrode C141 and connecting the second conductive line P142 to the second electrode C142. The material of the electrode adhesive ECA was described above with reference to FIGS. 6 to 10C.

The first and second conductive lines P141 and P142 and the first and second electrodes C141 and C142 may be insulated from each other through an insulating layer IL formed therebetween. More specifically, in FIG. 13, in each of the first and second solar cells CE1 and CE2, the insulating layer IL may be positioned between the first conductive line P141 and the second electrode C142 and between the second conductive line P142 and the first electrode C141, thereby insulating the first conductive line P141 from the second electrode C142 and insulating the second conductive line P142 from the first electrode C141. The insulating layer IL was described above with reference to FIGS. 6 to 10C.

As shown in FIG. 13, the first and second conductive lines P141 and P142 included in each of the first and second solar cells CE1 and CE2 may be connected to each other through a separate interconnector IC extending in the first direction x.

For example, the first conductive line P141 of the first solar cell CE1 and the second conductive line P142 of the second solar cell CE2 may be electrically connected to each other using an interconnector adhesive ICA with the interconnector IC interposed therebetween. Thus, in FIG. 13, the first and second solar cells CE1 and CE2 may be connected in series to each other through the interconnector IC and may be arranged in the second direction y. The material of the interconnector adhesive ICA was described above with reference to FIGS. 1 to 5.

As shown in FIG. 13, the thermal expansion stress of each solar cell included in the solar cell module, in which the longitudinal direction of the first and second electrodes C141 and C142 crosses the longitudinal direction of the first and second conductive lines P141 and P142, may be less than the thermal expansion stress of each solar cell included in the solar cell module shown in FIGS. 1 to 10C.

In other words, when the longitudinal direction of the first and second electrodes C141 and C142 crosses the longitudinal direction of the first and second conductive lines P141 and P142, a thermal contraction direction of the first and second electrodes C141 and C142 may cross a thermal contraction direction of the first and second conductive lines P141 and P142. Therefore, the thermal expansion stress applied to the semiconductor substrate 110 may be further reduced, and a bending phenomenon of the semiconductor substrate 110 may be further reduced.

Even in the solar cell module shown in FIG. 13, at least one of an area of an overlap portion, an area of a connection portion, a connection position, and a connection shape between the interconnector IC and the first conductive line P141 of the first solar cell CE1 may be different from at least one of an area of an overlap portion, an area of a connection portion, a connection position, and a connection shape between the interconnector IC and the second conductive line P142 of the second solar cell CE2.

For example, as shown in FIG. 14, a sum of areas of a plurality of first connection portions CS1a to CS1c between the interconnector IC and the first conductive line P141 having the plurality of wires in the first solar cell CE1 may be different from a sum of areas of a plurality of second connection portions CS2a to CS2c between the interconnector IC and the second conductive line P142 having the plurality of wires in the second solar cell CE2.

For example, as shown in FIG. 14, a sum of the areas of the plurality of first connection portions CS1a to CS1c may be greater than a sum of the areas of the plurality of second connection portions CS2a to CS2c. On the contrary, a sum of the areas of the plurality of second connection portions CS2a to CS2c may be greater than a sum of the areas of the plurality of first connection portions CS1a to CS1c.

An overlap length OS1 between each of the plurality of first connection portions CS1a to CS1c and the interconnector IC may be different from an overlap length OS2 between each of the plurality of second connection portions CS2a to CS2c and the interconnector IC. For example, as shown in FIG. 14, the overlap lengths OS1 of the first connection portions CS1a to CS1c may be greater than the overlap lengths OS2 of the second connection portions CS2a to CS2c. On the contrary, the overlap lengths OS2 of the second connection portions CS2a to CS2c may be greater than the overlap lengths OS1 of the first connection portions CS1a to CS1c.

When the areas or the overlap lengths of the first connection portions CS1a to CS1c are different from the areas or the overlap lengths of the second connection portions CS2a to CS2c, the alignment process of the first and second conductive lines P141 and P142 having the plurality of wires may be more easily performed in the process for connecting the plurality of solar cells in series.

In FIG. 14, shown is the instance in which the overlap lengths OS1 of the plurality of first connection portions CS1a to CS1c are the same as one another, and the overlap lengths OS2 of the plurality of second connection portions CS2a to CS2c are the same as one another. On the contrary, the overlap length between one (for example, CS1a) of the plurality of first connection portions CS1a to CS1c and the interconnector IC may be different from the overlap length between the remaining first connection portion (for example, CS1b or CS1c) and the interconnector IC. Further, the overlap length between one (for example, CS2a) of the plurality of second connection portions CS2a to CS2c and the interconnector IC may be different from the overlap length between the remaining second connection portion (for example, CS2b or CS2c) and the interconnector IC.

In each of the first and second solar cells CE1 and CE2 according to the embodiment of the invention, a connection position or a connection area of at least one of the plurality of first connection portions CS1a to CS1c connected to the interconnector IC may be different from a connection position or a connection area of the remaining first connection portions.

Further, in each of the first and second solar cells CE1 and CE2 according to the embodiment of the invention, a connection position or a connection area of at least one of the plurality of second connection portions CS2a to CS2c connected to the interconnector IC may be different from a connection position or a connection area of the remaining second connection portions.

For example, as shown in FIG. 15A, the areas of the plurality of first connection portions CS1a to CS1c (or the plurality of second connection portions CS2a to CS2c) may be different from one another.

Further, as shown in FIG. 15B, a connection position of the first connection portion CS1b (or the second connection portion CS2b) of the plurality of first connection portions CS1a to CS1c (or the plurality of second connection portions CS2a to CS2c) may be a distance D1 away from an end of the first conductive line P141 (or the second conductive line P142). Further, a connection position of the first connection portions CS1a and CS1c (or the second connection portions CS2a and CS2c) may be a distance D2 less than the distance D1 from the end of the first conductive line P141 (or the second conductive line P142).

In FIG. 14, shown is the instance in which the parts CS1a to CS1c of the first connection portion CS1 have a quadrangle shape and the parts CS2a to CS2c of the second connection portion CS2 have a quadrangle shape. However, the connection shape of each part of the first connection portion CS1 may be different from the connection shape of each part of the second connection portion CS2.

For example, the connection shapes of the parts CS1a to CS1c of the first connection portion CS1 may be the quadrangle shape as shown in FIG. 14, and the connection shapes of the parts CS2a to CS2c of the second connection portion CS2 may be a circular or oval shape as shown in FIG. 15A or 15B. On the contrary, the connection shapes of the parts CS1a to CS1c of the first connection portion CS1 may be the circular or oval shape, and the connection shapes of the parts CS2a to CS2c of the second connection portion CS2 may be the quadrangle shape.

Further, the connection shapes of the parts CS1a to CS1c of the first connection portion CS1 may be different from one another, and the connection shapes of the parts CS2a to CS2c of the second connection portion CS2 may be different from one another.

When the connection positions or the connection areas between the first and second conductive lines P141 and P142 and the interconnector IC are different from one another as described above, the series connection of the solar cells may be more easily performed.

In FIGS. 11 to 15B, shown is the instance in which each of the first and second conductive lines P141 and P142 is configured as the plurality of wires. However, the embodiment of the invention may be equally applied to the first and second conductive lines P141 and P142, each of which is configured as a plurality of ribbons.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
 a first solar cell and a second solar cell each including a plurality of first and second electrodes extending in a first direction on a back surface of a semiconductor substrate, the first solar cell and the second solar cell being separated from each other in a second direction crossing the first direction, and the first solar cell and the second solar cell being adjacent to each other in the second direction to form a cell string;
a plurality of first conductive lines extending in the second direction, the plurality of first conductive lines being electrically connected to the plurality of first electrodes in each of the first and second solar cells through a first electrode adhesive and insulated to the plurality of second electrodes in each of the first and second solar cells by a first insulating layer;
a plurality of second conductive lines extending in the second direction, the plurality of second conductive lines being electrically connected to the plurality of second electrodes in each of the first and second solar cells through a second electrode adhesive and insulated to the plurality of first electrodes in each of the first and second solar cells by a second insulating layer; and
an interconnector disposed between the first solar cell and the second solar cell of the cell string and spaced apart from the first solar cell and the second solar cell, and extending in the first direction in order to form the cell string with the first solar cell and the second solar cell,
wherein the plurality of first conductive lines of the first solar cell and the plurality of second conductive lines of the second solar cell are overlapped and connected to the interconnector disposed between the first solar cell and the second solar cell in order to form the cell string with the first solar cell and the second solar cell,
wherein an electrode arrangement of the first solar cell, a first insulating layer arrangement of the first solar cell and a first electrode adhesive arrangement of the first solar cell are equal to an electrode arrangement of the second solar cell, a second insulating layer arrangement of the second solar cell and a second electrode adhesive arrangement of the second solar cell,
wherein each of the plurality of first conductive lines and the plurality of second conductive lines is configured as a ribbon having a first surface and a second surface opposite the first surface,
wherein the first surface is connected to the first and second electrodes and the interconnector, and the first surface is directly facing the first and second electrodes and the interconnector,
wherein a connection region between the first surface and the interconnector is a region to which a thermal expansion stress is applied when the interconnector is connected to each of the first solar cell and the second solar cell, and
wherein on the first solar cell or the second solar cell, a first area of a first connection portion that connects the first surface of each first conductive line of a first set of the plurality of first conductive lines to the interconnector is different than a second area of a second connection portion that connects the first surface of each first conductive line of a second set of the plurality of first conductive lines to the interconnector while an overlap length of the plurality of first conductive lines is the same.

2. The solar cell module of claim 1, wherein at least one of an area of an overlap portion, an area of a connection portion, a connection position, and a connection shape between the interconnector and the first conductive lines of the first solar cell is further different from at least one of an area of an overlap portion, an area of a connection portion, a connection position, and a connection shape between the interconnector and the second conductive lines of the second solar cell, wherein a first connection portion between the interconnector and the first conductive lines of the first solar cell is separated in the overlap portion between the interconnector and the first conductive lines and is in the plural, and
wherein a second connection portion between the interconnector and the second conductive lines of the second solar cell is separated in the overlap portion between the interconnector and the second conductive lines and is in the plural.

3. The solar cell module of claim 2, wherein the total area of the plurality of first connection portions is different from the total area of the plurality of second connection portions.

4. The solar cell module of claim 2, wherein the interconnector is connected to the first and second conductive lines of the first and second solar cells using an interconnector adhesive formed of a conductive material.

5. The solar cell module of claim 4, wherein a plane area size of a first application portion of the interconnector adhesive in the overlap portion between the interconnector and the first conductive lines is different from a plane area size of a second application portion of the interconnector adhesive in the overlap portion between the interconnector and the second conductive lines.

6. The solar cell module of claim 5, wherein the first application portion in the overlap portion between the interconnector and the first conductive lines is separated in the second direction crossing the first direction and is in the plural, and
wherein the second application portion in the overlap portion between the interconnector and the second conductive lines is separated in the second direction and is in the plural.

7. The solar cell module of claim 6, wherein the total area of the plurality of first application portions is different from the total area of the plurality of second application portions.

8. The solar cell module of claim 2, wherein a first overlap area between the interconnector and the first conductive lines is different from a second overlap area between the interconnector and the second conductive lines.

9. The solar cell module of claim 8, wherein the connection of the first solar cell and the second solar cell using the interconnector is arranged in the second direction, and
wherein a first overlap width between the interconnector and the first conductive lines in the first direction is different from a second overlap width between the interconnector and the second conductive lines in the first direction.

10. A solar cell module comprising:
a first solar cell and a second solar cell each including a plurality of first and second electrodes, which are extending in a first direction on a back surface of a semiconductor substrate, the first and second solar cells being separated from each other in a second direction crossing the first direction, and the first solar cell and the second solar cell being adjacent to each other in the second direction to form a cell string;
a plurality of first conductive lines extending m the second direction, electrically connected to the plurality of first electrodes in each of the first and second solar cells through a first electrode adhesive, and insulated to the plurality of second electrodes in each of the first and second solar cells using a first insulating layer selectively formed in the second electrodes;
a plurality of second conductive lines extending in the second direction, electrically connected to the plurality of second electrodes in each of the first and second solar cells through a second electrode adhesive and insulated to the plurality of first electrodes in each of the first and second solar cells using a second insulating layer selectively formed in the first electrodes; and an interconnector configured to electrically connect the plurality of first conductive lines of the first solar cell to the plurality of second conductive lines of the second solar cell in order to form the cell string with the first solar cell and the second solar cell, and the interconnector being disposed between the first solar cell and the second solar cell and spaced apart from the first solar cell and the second solar cell, wherein the plurality of first conductive lines of the first solar cell and the plurality of second conductive lines of the second solar cell are overlapped and connected to the interconnector disposed between the first solar cell and second solar cell in order to form the cell string with the first solar cell and the second solar cell, wherein an electrode arrangement of the first solar cell, a first insulating layer arrangement of the first solar cell and a first electrode adhesive arrangement of the first solar cell are equal to an electrode arrangement of the second solar cell, a second insulating layer arrangement of the second solar cell and a second electrode adhesive arrangement of the second solar cell, wherein each of the plurality of first conductive lines and the plurality of second conductive lines is configured as a ribbon having a first surface and a second surface opposite the first surface, wherein the first surface is connected to the first and second electrodes and the interconnector, and the first surface is directly facing the first and second electrodes and the interconnector, wherein a connection region between the first surface and the interconnector is a region to which a thermal expansion stress is applied when the interconnector is connected to each of the first solar cell and the second solar cell, and wherein on the first solar cell or the second solar cell, a first area of a first connection portion that connects the first surface of each first conductive line of a first set of the plurality of first conductive lines to the interconnector is different than a second area of a second connection portion that connects the first surface of each first conductive line of a second set of the plurality of first conductive lines to the interconnector while an overlap length of the plurality of first conductive lines is the same.

11. The solar cell module of claim 10, wherein each of a first connection portion between the interconnector and the first conductive lines of the first solar cell and a second connection portion between the interconnector and the second conductive lines of the second solar cell includes a plurality of first connection parts and a plurality of second connection parts, respectively, wherein at least one of the first connection parts has a size that is different from an adjacent first connection part or an adjacent second connection part that is disposed in at least one of the first direction and the second direction from the at least one of the first connection parts, and wherein the at least one of the first connection parts has a size that is different from the adjacent second connection part that is disposed in the second direction from the at least one of the first connection parts.

12. The solar cell module of claim 11, wherein the first connection portion is a portion of adhesion between the interconnector and the first conductive lines of the first solar cell, and the second connection portion is a portion of adhesion between the interconnector and the second conductive lines of the second solar cell.

13. The solar cell module of claim 10, wherein each of a first connection portion between the interconnector and the first conductive lines of the first solar cell and a second connection portion between the interconnector and the second conductive lines of the second solar cell is disposed between the first solar cell and the second solar cell.

14. The solar cell module of claim 10, wherein each of the first connection portion and the second connection portion is disposed at a back surface of the interconnector.

15. The solar cell module of claim 10, wherein the plurality of first conductive lines are electrically connected to the plurality of first electrodes using a conductive adhesive layer selectively formed on the first electrodes and the plurality of second conductive lines are electrically connected to the plurality of second electrodes using the conductive adhesive layer selectively formed on the second electrodes.

16. The solar cell module of claim 15, wherein each area of the insulating layers is more than each area of the conductive adhesive layers.

17. The solar cell module of claim 1, further comprising:
a plurality of emitter regions extending in the first direction and respectively connected to the plurality of first electrodes; and
a plurality of back surface field regions extending in the first direction and respectively connected to the plurality of second electrodes,
wherein the interconnector is parallel to the plurality of emitter regions and the plurality of back surface field regions.

18. The solar cell module of claim 10, further comprising:
a plurality of emitter regions extending in the first direction and respectively connected to the plurality of first electrodes; and
a plurality of back surface field regions extending in the first direction and respectively connected to the plurality of second electrodes,
wherein the interconnector is parallel to the plurality of emitter regions and the plurality of back surface field regions.

19. The solar cell module of claim 1, wherein each of the first and second conductive lines is configured as a plurality of wires.

20. The solar cell module of claim 10, wherein each of the first and second conductive lines is configured as a plurality of wires.

21. The solar cell module of claim 1, wherein the interconnector is a first interconnector,
wherein the solar cell module further including a second interconnector disposed at an opposite side of the first solar cell and connected to the plurality of second conductive lines of the first solar cell, and
wherein a length of the second interconnector IS equal to a length of the first interconnector in the first direction.

22. The solar cell module of claim 21, further including a third interconnector disposed at an opposite side of the second solar cell and connected to the plurality of first conductive lines of the second solar cell, and
wherein a length of the third interconnector is equal to the length of the first interconnector in the first direction.

23. The solar cell module of claim 10, wherein the interconnector is a first interconnector,
wherein the solar cell module further including a second interconnector disposed at an opposite side of the first solar cell and connected to the plurality of second conductive lines of the first solar cell, and wherein a length of the second interconnector is equal to a length of the first interconnector in the first direction.

24. The solar cell module of claim 23, further including a third interconnector disposed at an opposite side of the second solar cell and connected to the plurality of first conductive lines of the second solar cell, and wherein a length of the third interconnector 1s equal to the length of the first interconnector in the first direction.

25. The solar cell module of claim 1, wherein an overlap length of the plurality of first conductive lines with the interconnector is greater than an overlap length of the plurality of second conductive lines with the interconnector.

26. The solar cell module of claim 10, wherein an overlap length of the plurality of first conductive lines with the interconnector is greater than an overlap length of the plurality of second conductive lines with the interconnector.

* * * * *